(12) United States Patent
Chaji

(10) Patent No.: US 9,190,456 B2
(45) Date of Patent: Nov. 17, 2015

(54) HIGH RESOLUTION DISPLAY PANEL WITH EMISSIVE ORGANIC LAYERS EMITTING LIGHT OF DIFFERENT COLORS

(75) Inventor: Gholamreza Chaji, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 430 days.

(21) Appl. No.: 13/456,043

(22) Filed: Apr. 25, 2012

(65) Prior Publication Data

US 2013/0285537 A1 Oct. 31, 2013

(51) Int. Cl.
*H05B 33/14* (2006.01)
*H01J 9/00* (2006.01)
*H01L 27/32* (2006.01)

(52) U.S. Cl.
CPC .......... *H01L 27/3213* (2013.01); *H01L 27/322* (2013.01); *H01L 27/3216* (2013.01)

(58) Field of Classification Search
CPC ............ H01L 27/3213; H01L 27/3216; H01L 27/322; H01L 27/3218; H01L 27/3241; H01L 33/50
USPC .................................................. 313/504–506
See application file for complete search history.

(56) References Cited

U.S. PATENT DOCUMENTS

| | | | |
|---|---|---|---|
| 4,354,162 A | 10/1982 | Wright | |
| 5,589,847 A | 12/1996 | Lewis | |
| 5,670,973 A | 9/1997 | Bassetti et al. | |
| 5,748,160 A | 5/1998 | Shieh et al. | |
| 5,815,303 A | 9/1998 | Berlin | |
| 6,097,360 A | 8/2000 | Holloman | |
| 6,259,424 B1 | 7/2001 | Kurogane | |
| 6,288,696 B1 | 9/2001 | Holloman | |
| 6,320,325 B1 | 11/2001 | Cok et al. | |
| 6,414,661 B1 | 7/2002 | Shen et al. | |
| 6,580,657 B2 | 6/2003 | Sanford et al. | |
| 6,594,606 B2 | 7/2003 | Everitt | |

(Continued)

FOREIGN PATENT DOCUMENTS

| CA | 1294034 | 1/1992 |
|---|---|---|
| CA | 2368386 | 9/1999 |

(Continued)

OTHER PUBLICATIONS

Ahnood et al.: "Effect of threshold voltage instability on field effect mobility in thin film transistors deduced from constant current measurements"; dated Aug. 2009.

(Continued)

*Primary Examiner* — Sikha Roy
(74) *Attorney, Agent, or Firm* — Nixon Peabody LLP

(57) ABSTRACT

An arrangement for a high resolution active matrix display includes organic emissive layers of distinct colors each deposited across continuous regions so as to include more than one pixel emissive region. Color filters are situated to partially block light from at least some of the emissive regions such that primary additive colors are transmitted from distinct subsets of pixels. The emissive layers may be deposited in alternating parallel stripes along rows or columns of the display, or may be oriented perpendicularly with respect to one another such that the emissive layers overlap in the emissive regions of at least some pixels. In some examples, red, green, and blue of pixels are arranged in regular patterns across the display and with the emissive regions for the blue pixels forming a relatively larger area of the display than either the red or green pixels.

4 Claims, 12 Drawing Sheets

(56) References Cited

U.S. PATENT DOCUMENTS

| | | |
|---|---|---|
| 6,618,030 B2 | 9/2003 | Kane et al. |
| 6,687,266 B1 | 2/2004 | Ma et al. |
| 6,690,344 B1 | 2/2004 | Takeuchi et al. |
| 6,693,388 B2 | 2/2004 | Oomura |
| 6,720,942 B2 | 4/2004 | Lee et al. |
| 6,738,035 B1 | 5/2004 | Fan |
| 6,771,028 B1 | 8/2004 | Winters |
| 6,777,712 B2 | 8/2004 | Sanford et al. |
| 6,806,638 B2 | 10/2004 | Lih et al. |
| 6,809,706 B2 | 10/2004 | Shimoda |
| 6,909,419 B2 | 6/2005 | Zavracky et al. |
| 6,919,681 B2 | 7/2005 | Cok et al. |
| 6,937,215 B2 | 8/2005 | Lo |
| 6,943,500 B2 | 9/2005 | LeChevalier |
| 6,995,510 B2 | 2/2006 | Murakami et al. |
| 6,995,519 B2 | 2/2006 | Arnold et al. |
| 7,027,015 B2 | 4/2006 | Booth, Jr. et al. |
| 7,034,793 B2 | 4/2006 | Sekiya et al. |
| 7,106,285 B2 | 9/2006 | Naugler |
| 7,274,363 B2 | 9/2007 | Ishizuka et al. |
| 7,321,348 B2 | 1/2008 | Cok et al. |
| 7,368,868 B2 * | 5/2008 | Sakamoto ............. 313/505 |
| 7,502,000 B2 | 3/2009 | Yuki et al. |
| 7,535,449 B2 | 5/2009 | Miyazawa |
| 7,554,512 B2 | 6/2009 | Steer |
| 7,619,594 B2 | 11/2009 | Hu |
| 7,619,597 B2 | 11/2009 | Nathan et al. |
| 7,812,529 B2 * | 10/2010 | Choi et al. ............. 313/506 |
| 7,994,712 B2 | 8/2011 | Sung et al. |
| 8,049,420 B2 | 11/2011 | Tamura et al. |
| 8,552,636 B2 * | 10/2013 | Chaji et al. ............. 313/504 |
| 2002/0084463 A1 | 7/2002 | Sanford et al. |
| 2002/0101172 A1 | 8/2002 | Bu |
| 2002/0158823 A1 | 10/2002 | Zavracky et al. |
| 2002/0186214 A1 | 12/2002 | Siwinski |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2003/0020413 A1 | 1/2003 | Oomura |
| 2003/0030603 A1 | 2/2003 | Shimoda |
| 2003/0076048 A1 | 4/2003 | Rutherford |
| 2003/0151569 A1 | 8/2003 | Lee et al. |
| 2003/0179626 A1 | 9/2003 | Sanfod et al. |
| 2004/0066357 A1 | 4/2004 | Kawasaki |
| 2004/0135749 A1 | 7/2004 | Kondakov et al. |
| 2004/0183759 A1 | 9/2004 | Stevenson et al. |
| 2004/0189627 A1 | 9/2004 | Shirasaki et al. |
| 2004/0257355 A1 | 12/2004 | Naugler |
| 2005/0073264 A1 | 4/2005 | Matsumoto |
| 2005/0088085 A1 * | 4/2005 | Nishikawa et al. ............. 313/506 |
| 2005/0110420 A1 | 5/2005 | Arnold et al. |
| 2005/0140610 A1 | 6/2005 | Smith et al. |
| 2005/0145891 A1 | 7/2005 | Abe |
| 2005/0156831 A1 | 7/2005 | Yamazaki et al. |
| 2006/0038758 A1 | 2/2006 | Routley et al. |
| 2006/0097628 A1 | 5/2006 | Suh et al. |
| 2006/0232522 A1 | 10/2006 | Roy et al. |
| 2007/0001588 A1 | 1/2007 | Boroson et al. |
| 2007/0046195 A1 * | 3/2007 | Chin et al. ............. 313/506 |
| 2007/0080908 A1 | 4/2007 | Nathan et al. |
| 2007/0182671 A1 | 8/2007 | Nathan et al. |
| 2008/0001525 A1 | 1/2008 | Chao et al. |
| 2008/0252202 A1 * | 10/2008 | Li et al. ............. 313/504 |
| 2009/0051283 A1 * | 2/2009 | Cok et al. ............. 313/506 |
| 2010/0052524 A1 * | 3/2010 | Kinoshita ............. 313/504 |
| 2010/0090241 A1 | 4/2010 | D'Andrade et al. |
| 2010/0133994 A1 * | 6/2010 | Song et al. ............. 313/504 |
| 2010/0156279 A1 * | 6/2010 | Tamura et al. ............. 313/504 |
| 2011/0133636 A1 * | 6/2011 | Matsuo et al. ............. 313/504 |
| 2011/0180825 A1 * | 7/2011 | Lee et al. ............. 257/89 |
| 2013/0113785 A1 * | 5/2013 | Sumi ............. 345/419 |

FOREIGN PATENT DOCUMENTS

| | | |
|---|---|---|
| CA | 2432530 | 7/2002 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| EP | 0 158 366 | 10/1985 |
| EP | 1 194 013 | 3/2002 |
| EP | 1 246 246 | 10/2002 |
| EP | 1 335 430 A1 | 8/2003 |
| EP | 1 381 019 | 1/2004 |
| EP | 1 521 203 A2 | 4/2005 |
| EP | 1 594 347 | 11/2005 |
| JP | 10-254410 | 9/1998 |
| JP | 2002-278513 | 9/2002 |
| JP | 2003-076331 | 3/2003 |
| JP | 2003-308046 | 10/2003 |
| WO | 9948079 | 9/1999 |
| WO | 01/27910 A1 | 4/2001 |
| WO | 03/034389 | 4/2003 |
| WO | 03/063124 | 7/2003 |
| WO | 2004/003877 | 1/2004 |
| WO | 2004/034364 | 4/2004 |
| WO | 2005/022498 | 3/2005 |
| WO | 2005/055185 | 6/2005 |
| WO | 2006/063448 | 6/2006 |
| WO | 2009/055920 A1 | 5/2009 |

OTHER PUBLICATIONS

Alexander et al.: "Pixel circuits and drive schemes for glass and elastic AMOLED displays"; dated Jul. 2005 (9 pages).

Alexander et al.: "Unique Electrical Measurement Technology for Compensation, Inspection, and Process Diagnostics of AMOLED HDTV"; dated May 2010 (4 pages).

Arokia Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.

Ashtiani et al.: "AMOLED Pixel Circuit With Electronic Compensation of Luminance Degradation"; dated Mar. 2007 (4 pages).

Chaji et al.: "A Current-Mode Comparator for Digital Calibration of Amorphous Silicon AMOLED Displays"; dated Jul. 2008 (5 pages).

Chaji et al.: "A fast settling current driver based on the CCII for AMOLED displays"; dated Dec. 2009 (6 pages).

Chaji et al.: "A Low-Cost Stable Amorphous Silicon AMOLED Display with Full V~T- and V~O~L~E~D Shift Compensation"; dated May 2007 (4 pages).

Chaji et al.: "A low-power driving scheme for a-Si:H active-matrix organic light-emitting diode displays"; dated Jun. 2005 (4 pages).

Chaji et al.: "A low-power high-performance digital circuit for deep submicron technologies"; dated Jun. 2005 (4 pages).

Chaji et al.: "A novel a-Si:H AMOLED pixel circuit based on short-term stress stability of a-Si:H TFTs"; dated Oct. 2005 (3 pages).

Chaji et al.: "A Novel Driving Scheme and Pixel Circuit for AMOLED Displays"; dated Jun. 2006 (4 pages).

Chaji et al.: "A novel driving scheme for high-resolution large-area a-Si:H AMOLED displays"; dated Aug. 2005 (4 pages).

Chaji et al.: "A Stable Voltage-Programmed Pixel Circuit for a-Si:H AMOLED Displays"; dated Dec. 2006 (12 pages).

Chaji et al.: "A Sub-μA fast-settling current-programmed pixel circuit for AMOLED displays"; dated Sep. 2007.

Chaji et al.: "An Enhanced and Simplified Optical Feedback Pixel Circuit for AMOLED Displays"; dated Oct. 2006.

Chaji et al.: "Compensation technique for DC and transient instability of thin film transistor circuits for large-area devices"; dated Aug. 2008.

Chaji et al.: "Driving scheme for stable operation of 2-TFT a-Si AMOLED pixel"; dated Apr. 2005 (2 pages).

Chaji et al.: "Dynamic-effect compensating technique for stable a-Si:H AMOLED displays"; dated Aug. 2005 (4 pages).

Chaji et al.: "Electrical Compensation of OLED Luminance Degradation"; dated Dec. 2007 (3 pages).

(56) References Cited

OTHER PUBLICATIONS

Chaji et al.: "eUTDSP: a design study of a new VLIW-based DSP architecture"; dated May 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High-Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
International Search Report corresponding to International Application No. PCT/IB2010/055541 filed Dec. 1, 2010, dated May 26, 2011; 5 pages.
Jafarabadiashtiani et al.: "A New Driving Method for a-Si AMOLED Displays Based on Voltage Feedback"; dated 2005 (4 pages).
Joon-Chul Goh et al., "A New a-Si:H Thin-Film Transistor Pixel Circuit for Active-Matrix Organic Light-Emitting Diodes", IEEE Electron Device Letters, vol. 24, No. 9, Sep. 2003, pp. 583-585.
Lee et al.: "Ambipolar Thin-Film Transistors Fabricated by PECVD Nanocrystalline Silicon"; dated 2006 (6 pages).
Ma E Y et al.: "organic light emitting diode/thin film transistor integration for foldable displays" dated Sep. 15, 1997(4 pages).
Matsueda y et al.: "35.1: 2.5-in. AMOLED with Integrated 6-bit Gamma Compensated Digital Data Driver"; dated May 2004.
Nathan A. et al., "Thin Film imaging technology on glass and plastic" ICM 2000, proceedings of the 12 international conference on microelectronics, dated Oct. 31, 2001 (4 pages).

Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a-Si for AMOLED—Meeting the Performance and Cost Demands of Display Applications (Cell Phone to HDTV)"; dated 2006 (4 pages).
Philipp: "Charge transfer sensing" Sensor Review, vol. 19, No. 2, Dec. 31, 1999, 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Stewart M. et al., "polysilicon TFT technology for active matrix oled displays" IEEE transactions on electron devices, vol. 48, No. 5, dated May 2001 (7 pages).
Vygranenko et al.: "Stability of indium—oxide thin-film transistors by reactive ion beam assisted deposition"; dated 2009.
Wang et al.: "Indium oxides by reactive ion beam assisted evaporation: From material study to device application"; dated Mar. 2009 (6 pages).
Written Opinion of the International Searching Authority corresponding to International Application No. PCT/IB2010/055541, dated May 26, 2011; 6 pages.
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
International Search Report mailed Aug. 16, 2013 which issued in corresponding International Patent Application No. PCT/IB2013/052746 (4 pages).
Written Opinion mailed Aug. 16, 2013 which issued in corresponding International Patent Application No. PCT/IB2013/052746 (8 pages).

\* cited by examiner

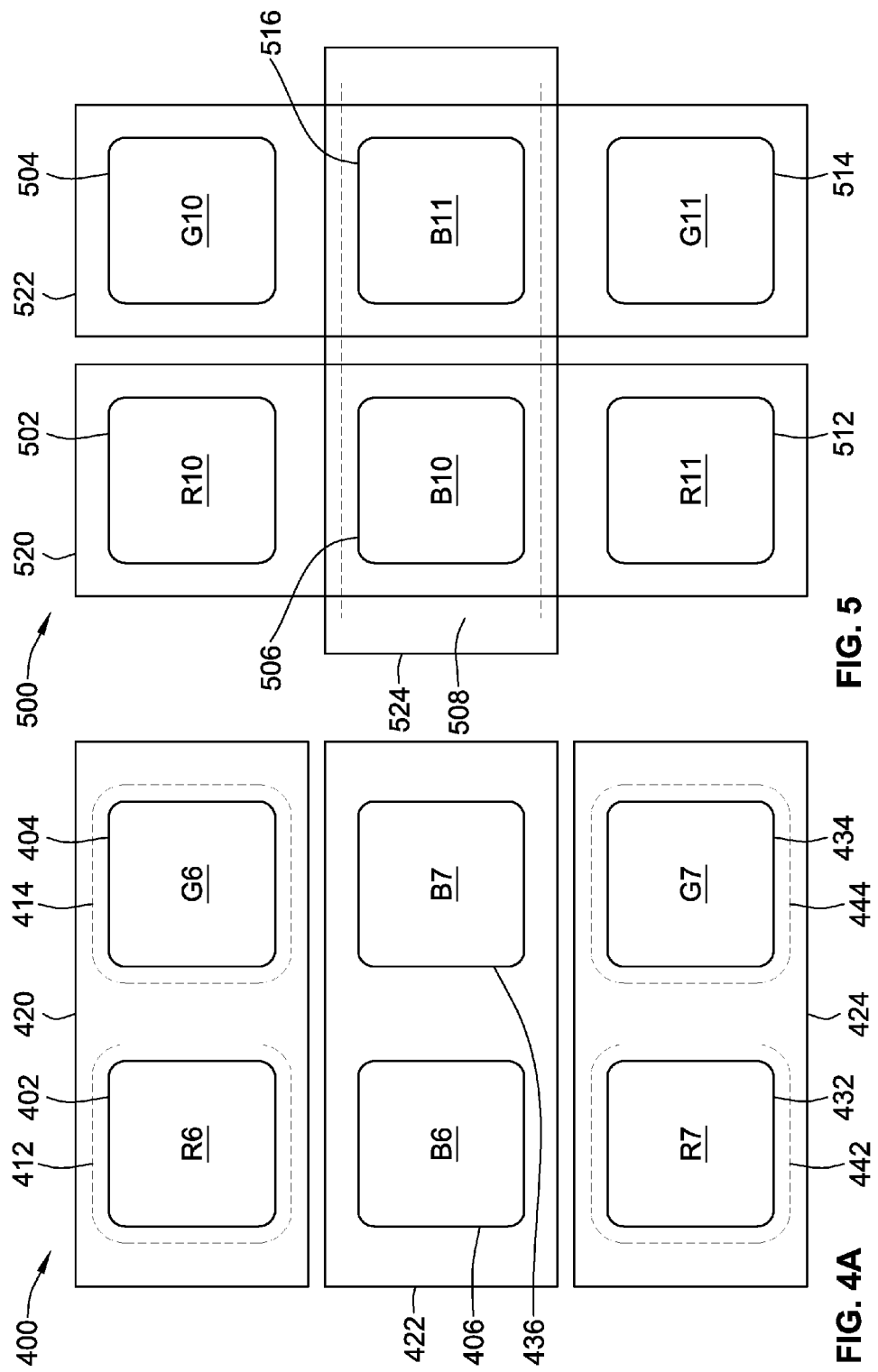

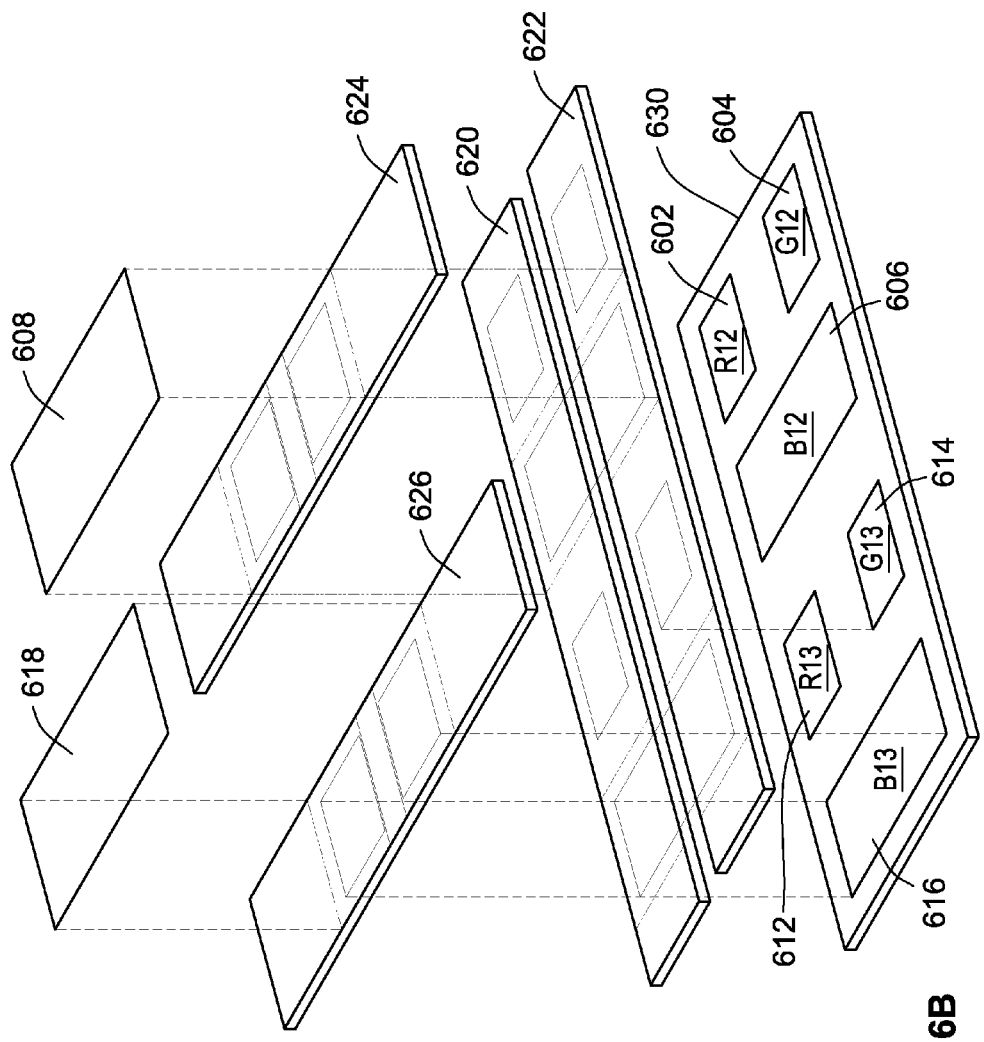

HIGH RESOLUTION DISPLAY PANEL WITH EMISSIVE ORGANIC LAYERS EMITTING LIGHT OF DIFFERENT COLORS

FIELD OF THE INVENTION

The present disclosure generally relates to flat panel displays formed by controllably depositing materials on a substrate and systems and methods for manufacturing such displays, and, more particularly, to organic light emitting diode displays where light emissive layers are deposited on a display substrate through a shadow mask.

BACKGROUND

Displays can be created from an array of organic light emitting devices ("OLEDs") each controlled by individual circuits (i.e., pixel circuits) having transistors for selectively controlling the circuits to be programmed with display information and to emit light according to the display information. Thin film transistors ("TFTs") fabricated on a substrate can be incorporated into such pixel circuits.

Generally, such pixel circuits include a drive transistor that conveys current through an organic emissive layer. Light is generated within the emissive layer due to recombination of holes and electrons passing through the layer in opposite directions. Accordingly, the intensity of emitted light is controlled by the amount of current flowing through the emissive layer, and the color of the emitted light is determined by the energy transitions allowed during recombination events, which is a function of the particular organic material selected as the emissive layer. Furthermore, current through the emissive layer is controlled by the voltage(s) applied to the drive transistor, which adjusts the conductivity of the drive transistor's channel region to control the current levels through the emissive layers (and the light emission).

Color displays are created by arranging a display with roughly a third of pixels emitting red light, a third emitting green light, and a third emitting blue light, with each group of three pixels forming an RGB pixel group composed of three sub-pixels that are independently programmed. Color content is displayed by programming each RGB pixel group to emit light according to a desired color for each position created by adding the RGB content together. Providing RGB pixels can be achieved by using emissive layers that generate light in red, green, and blue, respectively and patterning the appropriate emissive layers in the emissive regions of desired pixel circuits to create a desired RGB pattern.

Manufacturing such displays thus requires precisely patterning the respective emissive layers such that the appropriate emissive material is positioned in the proper emission region for each pixel. Shadow masks formed of thin metal are employed to screen regions where the emissive material is not desired while the emissive material is deposited on the display through the shadow mask. A shadow mask thus has a pattern of holes corresponding to the emission regions of all the red pixels and is aligned such that the holes match with the red pixels and the red emissive material is deposited. The shadow mask can then be moved (or another shadow mask positioned) such that holes align with the green pixels, and the green emissive material is deposited, etc. At very high pixel resolution (i.e., small pixel size) the holes in the shadow mask must become very small and the accuracy of the procedure suffers from non-uniformities in the emissive layers and difficulties in accurately aligning small holes.

In other examples, color displays can be formed from white emissive layers that are filtered to allow particular colors to be transmitted. That is, emissive layers that generate white light (which is itself a combination of red, green, and blue) can be provided in the emissive layers of all pixels. Color filters are arranged on the display substrate associated with particular pixels such that red, green, and blue light are transmitted from the display according to a desired RGB pattern. Filtering each color wastes a lot of power as a lot of generated light energy is simply filtered out with only a fraction being transmitted to contribute to the displayed color content.

SUMMARY

Arrangements and layouts are disclosed herein for multi-color pixel groups suitable for being patterned across a color display at a high pixel density. Some arrangements include organic emissive layers emitting distinct colors each deposited across continuous regions of a display panel so as to include more than one pixel emissive region. Color filters are situated to partially block light from at least some of the emissive regions such that primary additive colors are transmitted from distinct subsets of pixels on the display panel. Some arrangements provide for emissive layers deposited in alternating parallel stripes along rows or columns of the display. Some arrangements provide for emissive layers to be oriented perpendicularly with respect to one another such that the emissive layers overlap in a stacked configuration in the emissive regions of at least some pixels. In some examples, red, green, and blue of pixels are arranged in regular patterns across the display and with the emissive regions for the blue pixels forming a relatively larger area of the display than either the red or green pixels.

Aspects of the present disclosure provide a high resolution display panel including a display substrate, first and second substantially continuous emissive organic layer, and one or more first color filters. The display substrate includes a plurality of driving circuits each including a drive transistor coupled to an electrode such that the substrate includes a plurality of electrodes each coupled to a respective drive transistor. The first substantially continuous emissive organic layer is deposited in a first area of the display panel including at least two of the plurality of electrodes. The first emissive organic layer is configured to emit light according to a first color spectrum responsive to current being conveyed through the first emissive organic layer. The second substantially continuous emissive organic layer is deposited in a second area of the display panel including at least two of the plurality of electrodes. The second emissive organic layer configured to emit light according to a second color spectrum responsive to current being conveyed through the second emissive organic layer. The first color filters are situated to partially block light emitted from at least one of the first or the second emissive organic layers such that light transmitted through the one or more first color filters is characterized by a color spectrum for a first fundamental color.

Aspects of the present disclosure provide a method of fabricating a high resolution display panel that includes a display substrate with a plurality of driving circuits conveying currents to a plurality of electrodes via drive transistors and an emission region receiving the currents from the plurality of electrodes. The method includes depositing first and second substantially continuous emissive organic layers, and situating one or more first color filters situated to partially block light emitted from at least one of the first or the second emissive organic layers. The first substantially continuous emissive organic layer is deposited with a substantially constant thickness in a first area of the display panel including at least two of the plurality of electrodes. The first emissive organic layer is configured to emit light according to a first color spectrum responsive to current being conveyed through the first emissive organic layer. The second substantially continuous emissive organic layer is deposited with a substantially constant thickness in a second area of the display panel including at least two of the plurality of electrodes. The second emissive organic layer is configured to emit light according to a second color spectrum responsive to current being conveyed through the second emissive organic layer. The one or more one or more first color filters are situated to such that light transmitted through the one or more first color filters is characterized by a color spectrum for a first fundamental color.

Aspects of the present disclosure provide a high resolution display system including a display substrate, a first multi-color pixel group situated on the display substrate, and a controller. The first multi-color pixel group includes a first pixel circuit, a second pixel circuit, a first substantially continuous emissive layer, and a first color filter. The first pixel circuit includes a first emission region and a driving circuit having a drive transistor and a storage capacitor configured to convey current through the emission region via the drive transistor according to a charge on the storage capacitor. The second pixel circuit includes a second emission region and a driving circuit having a drive transistor and a storage capacitor configured to convey current through the emission region via the drive transistor according to a charge on the storage capacitor. The first substantially continuous emissive layer is deposited with a substantially constant thickness in a first area including the first emission region and the second emission region. The first emissive layer is configured to emit light according to a first color spectrum responsive to current being conveyed through the first emissive layer. The first color filter is situated to partially block light emitted from the first emission region such that light of a first fundamental color is transmitted through the first color filter. The controller is configured to program the driving circuits of the first and second pixel circuits according to programming information during a programming cycle such that the pixel circuits emit light according to the programming information during a driving cycle following the programming cycle.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIG. 2A is a top view of a layout for an RGBW multi-color pixel group formed with a substantially continuous strip of blue emissive material on the blue and white terminals.

FIG. 4A is another top view of a layout for RGB multi-color pixel groups formed from alternating strips of orange and blue emissive materials and with adjacent blue subpixels being associated with red and green sub-pixels in alternating upper and lower rows.

FIG. 5 is a top view of a layout for an RGB multi-color pixel group formed from parallel strips of red and green emissive materials overlapped with perpendicularly aligned strips of blue emissive material.

FIG. 6B is an aspect view of the RGB multi-color pixel groups of FIG. 6A showing alignment of the layers of emissive material and color filters with respect to a TFT backplane.

Figure 1A:
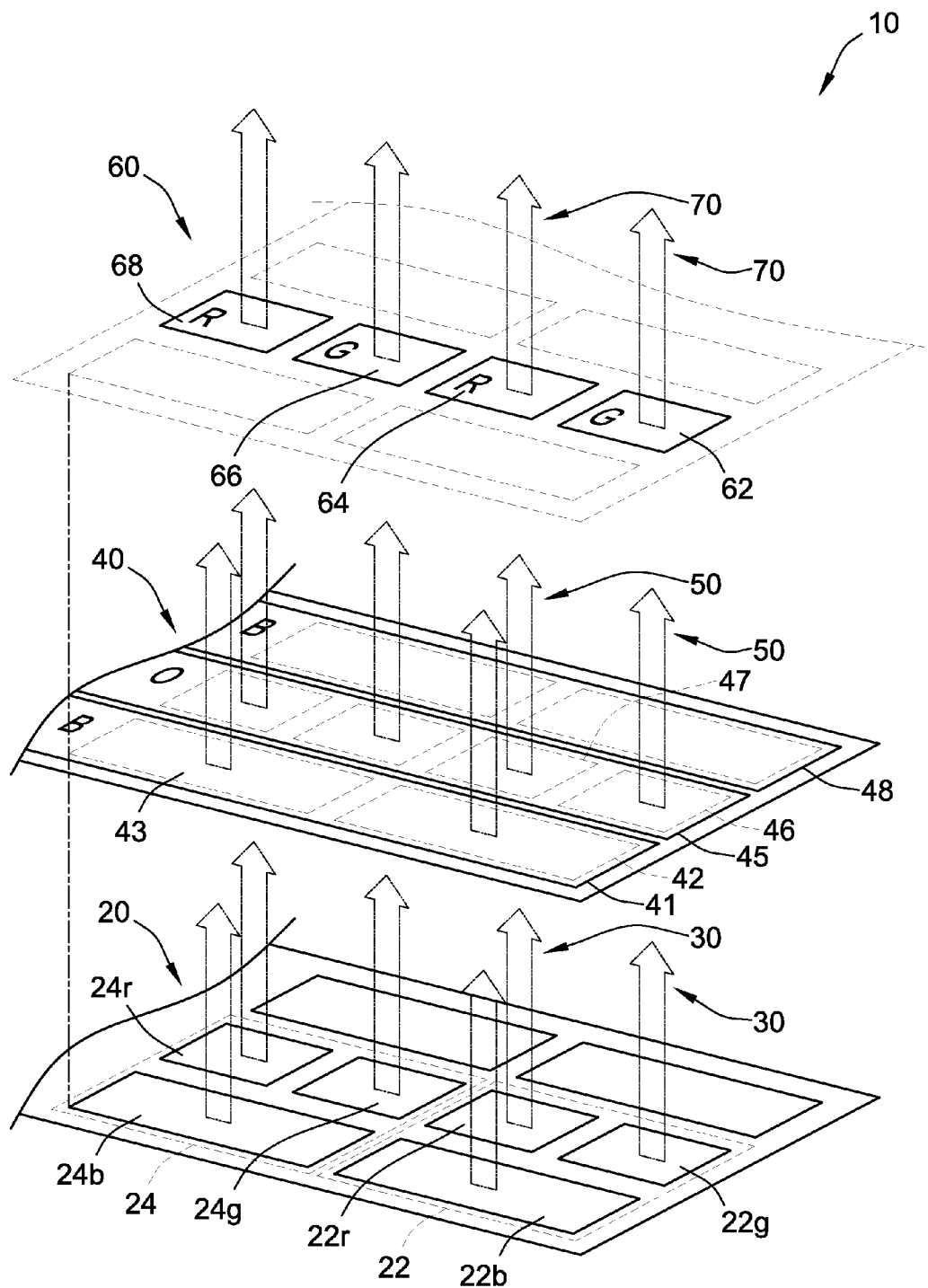
FIG. 1A is an exploded diagram of a display panel with a TFT backplane having an array of electrodes for driving current through one or more organic emissive layers and a pattern of color filters to partially block light from the emissive layers.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1A is an exploded diagram of a display panel 10 with a TFT backplane 20 having an array of electrodes for driving current through one or more organic emissive layers 40 and a pattern of color filters 60 to partially block light 50 from the emissive layers 40. The TFT backplane 20 can be formed on a substrate and include an array of pixel circuits for receiving programming information and conveying driving currents 30 through the emissive layers 40. Generally, the TFT backplane 20 includes an array of electrodes (e.g., the electrodes 22r, 22g, 22b, etc.) arranged in rows and columns with each electrode being associated with a distinct pixel circuit for driving current through the emissive layers 40 via its respective electrode.

Generally, the TFT backplane is an active matrix backplane and each pixel circuit in the TFT backplane includes a drive transistor and a storage capacitor. The drive transistor is generally in series with its respective electrode such that currents driven through the drive transistor are also conveyed through the corresponding portions of the emissive layers 40, via its respective electrode. The storage capacitor is generally situated to influence the conductance of the drive transistor such that the current conveyed through the drive transistor is controlled by the charge on the storage capacitor. The charge on the storage capacitor can be set (i.e., programmed) according to programming information conveyed to the pixel circuit via a data line driven by a data driver according to display information, such as, for example a digital video stream. Thus, in some embodiments, each pixel circuit can be programmed according to display information during a programming cycle, which charges the storage capacitor via voltage programming, current programming, or a combination thereof, and then driven to emit light according to the programming information during an emission cycle following the programming cycle. In some embodiments, the duration of the programming cycle corresponds to an interval during which the pixel circuit is connected to a data line.

An exemplary pixel circuit 100 is provided in FIG. 1B, which is discussed further below. In an example implementation, the pixel circuits in the TFT backplane 20 can be configured different from the pixel circuit 100 shown in FIG. 1B. The TFT backplane 20 can include connections to a data driver 132 and an address driver 134 to program and drive the pixel circuit 100 to convey the driving currents 30 to the emission layers 40 and thereby cause emitted light 50 to be transmitted through the color filter layer 60 such that the filtered light 70 is transmitted outward from the display system 10. As shown in the exemplary pixel circuit 100 of FIG. 1B, a controller 130 receives display data 138 and sends command signals to the address driver 134 and the data driver 132 cause the pixel circuit 100 to be programmed and driven according to the received display data 138. The controller 130 can also adjust ("tune") the programming and/or driving according to information stored in an associated memory 136. For example, the memory 136 can include a lookup table to provide adjustment values for one or more pixel circuits in the display panel including the pixel circuit 100 to scale or otherwise adjust programming values to account for degradation (e.g., aging) of the electrical components within the pixel circuit 100. For example, the programming values can be adjusted to account for changes in threshold voltage of the driving transistor, changes in the turn on voltage of the light emitting device, and/or changes in the current-voltage characteristics of the driving transistor. Additionally or alternatively, the memory 136 can store coefficients for formulas (or lookup tables) characterizing an amount of adjustment for each pixel circuit (or subsets thereof) based on the programming value provided, the operation history of the pixel circuit, one or more measurements of the pixel circuit (e.g., current values, light emission values, etc.), and/or the age ("operating hours") of the display.

Generally, the TFT backplane 20 includes a plurality of distinct pixel circuits that can each be programmed according to programming information and driven to provide a driving current through an emissive region according to the programming information. The driving currents can be conveyed via distinct driving terminals associated with each pixel circuit. By programming the full panel of such pixel circuits, the display panel 10 can be driven to display an image, and dynamically updating the displayed content at a sufficiently high refresh rate causes the display panel 10 to display video content. Furthermore, the display panel 10 can display color content by situating pixels that emit particular colors across the display panel. For example, the display panel 10 can be arranged with a regularly repeating pattern of red, green, and blue pixels such that a light can be generated from the display panel according to a programmable combination of red, green, and blue light. Additionally or alternatively, the display panel 10 can also be arranged with pixels emitting white light, cyan light, magenta light, yellow light, orange light, etc. The exemplary arrangement of color-specific pixels shown in FIG. 1A is described next in detail.

The TFT backplane 20 includes a first pixel group 22 and a second pixel group 24. Both the first pixel group 22 and the second pixel group 24 include three distinct pixel circuits each having a distinct terminal. The first pixel group 22 includes a red terminal 22r, a green terminal 22g, and a blue terminal 22b. The second pixel group 24 also includes a red terminal 24r, a green terminal 24g, and a blue terminal 24b. Driving currents 30 are conveyed via the respective terminals 22r,g,b, 24r,g,b, etc. to the emissive layer 40. The emissive layer 40 is arranged with alternating elongated strips of substantially continuous blue emissive material 41, 48 and orange emissive material 45. Certain organic materials have molecular structures that provide an energy gap between the highest occupied molecular orbital and the lowest unoccupied molecular orbital, and by injecting holes and free electrons to the organic material, luminescent recombination events occur to emit light with characteristic energies near the energy gap. Accordingly, particular organic materials can be selected with electroluminescence spectra of varying colors, such as materials emitting blue light, orange light, red light, etc. to generate the emitted light 50 with desired color characteristics. In the display panel 10 shown in FIG. 1A, the strips of blue emissive material 41, 48 emit blue light while the strip of orange emissive material 45 emits orange light.

The first strip of blue emissive material 41 is situated to overlap ("coat") the blue terminals 22b, 24b from the first and second pixel groups 22, 24. The first strip of blue emissive material 41 can be developed over the blue terminals 22b, 24b by a deposition process using a thin shadow mask with an elongated slit opening situated over an area including the blue terminals 22b, 24b. Similarly, the strip of orange emissive material 45 is situated to overlap ("coat") the red and green terminals 22r,g and 24r,g from the first and second pixel groups 22, 24, and can be developed by a deposition processing using a thin shadow mask having an elongated slit opening. Thus, the strips of emissive material 41, 45 generally each extend continuously over an area of the display panel that includes more than one terminal of the TFT backplane 20. However, as previously described the emissivity of the emissive strips 41, 45 (i.e., the luminance emitted light 50) is regulated by the amount of current flowing through the materials (and thus the amount of light-emitting recombination events occurring within the materials).

The driving currents 30 flow through the emissive layers 40 primarily vertically through the material along the shortest path between the terminals of the TFT backplane and corresponding terminals on the opposite side of the emissive layer 40, which may be, for example, transparent conductive terminals of indium tin oxide (ITO) or a similar material providing a supply line voltage (e.g., Vdd or Vss). In particular, the emissive layers 40 are relatively resistive to current flowing horizontally along the layers 40, rather than through the layers 40, thus the driving currents 30 from each terminal in the TFT backplane 20 generally flow through the layers 40 only in confined regions situated over each terminal. In other words, the strips of emissive material 41, 45, 48 can be considered as an array of separately programmed emissive regions for each pixel circuit, even though the strips 41, 45, 48 are arranged as continuous layers spanning multiple pixels. In the exemplary configuration of the display panel 10, the first strip of emissive blue material 41 includes a first area 42 and a second area 43 each situated over a distinct terminal in the TFT backplane 20. The first area 42 is situated to overlap the blue terminal 22b in the first pixel group 22 and emit blue light according to the driving current 30 from the blue terminal 22b. The second area 43 is similarly situated to overlap the blue terminal 24b in the second pixel group 24 and emit blue light according to the driving current 30 from the blue terminal 24b.

Similarly, the strip of emissive orange material 45 includes multiple discrete areas corresponding to the distinct terminals of the TFT backplane 20, where each area in the orange strip 45 luminesces according to the driving currents 30 from each terminal. By way of example, the strip of orange emissive material 45 includes a first area 46 situated to emit orange light according to a driving current 30 conveyed from the green terminal 22g and also a second area 47 situated to emit orange light according to a driving current 30 conveyed from the red terminal 22g. The patterned color filters 60 are arranged over the strip of orange emissive material 45 to selectively transmit the red components (70) and green components (70) of the emitted orange light 50. A green filter 62 is arranged over the first area 46 and a red filter is arranged over the second area 47. Similarly, a green filter 66 and a red filter 68 are arranged over the orange emissive layer 45 at regions corresponding to the green terminal 24g and the red terminal 24r, respectively, for the second pixel group 24. The red filters 62, 66 selectively transmit the red color content from the electroluminescence spectrum of the orange emissive material 45 while the green filters 64, 68 selectively transmit the green color content from the electroluminescence spectrum of the orange emissive material 45. In some examples, the red and green filters can be applied by a lithographic process.

The display panel 10 provides one exemplary arrangement for constructing a high resolution color display. For example, because the organic emissive materials can be deposited as substantially continuous elongated strips that span multiple pixel circuits, the dimensions of the individual emissive regions/areas (e.g., the areas 46, 47, etc.) are not subject to several problems associated with other color displays. According to some other techniques, shadow masks made of thin metal (e.g., approximate thickness of 10 µm) with openings/holes arranged in a pattern for each color are placed over a display substrate before depositing color-specific emissive materials. For example, a shadow mask with openings at the positions of the red pixels is positioned over a display substrate with the openings aligned with the red pixels and a red emissive material was deposited; next a shadow mask with openings at the positions of the blue pixels is positioned over the display substrate and a blue emissive material was deposited, and so on for additional colors. These techniques suffers from difficulty in aligning the shadow masks with precision in two dimensions (along both height and width of the display panel), and also introduce practical limits on the minimum dimensions of the distinct emissive regions created via such shadow masks.

At very high display resolutions, with pixel resolutions approaching (or even exceeding) 300 pixels per inch (ppi), the pixel pitch (i.e., size of the active region for each pixel) is necessarily small, with typical dimensions of each emissive region on the order of 10-20 micrometers, which is also the approximate thickness of the shadow mask itself. In such instances, directional deposition processes suffer from a shadowing problem resulting in non-uniform thickness of the deposited organic film across the emissive region, even where the shadow mask is in direct contact with the display substrate. The non-uniform thickness results from the angle between the direction deposition source and the emissive region, resulting in some portion of the emissive region lacking a line-of-sight to the deposition source, due to an edge of the mask casting a "shadow" blocking a portion of the emissive region from the deposition source. The shadowed portion of the emissive region receives relatively little organic material in comparison to the non-shadowed portions of the emissive region. When the dimensions of the emissive region (i.e., the dimension of the openings in the shadow mask) are significantly larger than the dimensions of the thickness of the mask itself, this "shadowing" effect can largely be ignored. However, as the dimensions of the shadow mask approach the thickness of the shadow mask, the "shadowing" problem is exacerbated and can even result in an absence of organic emissive material in a portion of the emissive region.

Some aspects of the present disclosure allow for a shadow mask to be formed with elongated openings that correspond to an area of the TFT backplane 20 spanning more than one terminal. The elongated openings are less susceptible to shadowing effects because the boundaries of the resulting emissive regions are defined by edges of the shadow mask in one direction, rather than in both directions. In addition, the shadow masks can be generally arranged to be carefully aligned along one direction, with a greater alignment tolerance along the orientation of the elongated openings to facilitate rapid construction and assembly of such displays.

Furthermore, aspects of the present disclosure provide for situating color filters (e.g., the color filters 70) over one or more emissive layers (e.g., the orange emissive material 45) to selectively transmit light from the emissive material according to its color content. Advantageously, the present disclosure provides for displays that include color filters over only a portion ("sub-set") of the total pixels such that light generated in the sub-set is partially blocked (via the filters), while light generated by other pixels is not filtered. Using color filters to create color content is a wasteful energy-consuming process, because the emissive regions are required to generate light that does not contribute to the display content (i.e., the light that is filtered/absorbed in the color filters represents energy that does not contribute to the display content).

Thus, in contrast to a display that generates white light in the emissive regions for each pixel and then situates appropriate color filters over every pixel to selectively transmit light with the desired color content, the arrangement in FIG. 1A (and other arrangements discussed herein) allow for selective filtering of a subset of the pixels while other pixels emit light without being filtered. Such arrangements increase the energy efficiency and/or operating lifetime of such a device by decreasing the amount of light that is inefficiently produced (and absorbed in filters). In particular, the operating lifetimes of the emissive regions and/or the circuit elements in the TFT backplane can be extended by the present display arrangements by decreasing the amount of electrical stress on the semi-conductive components. Lowering the light production from each pixel decreases such stresses by decreasing current density through the emissive layers and the magnitude of the driving currents 30, and hence decreasing the voltage stresses on the respective driving transistors.

Some embodiments of the present disclosure further provide for multi-color pixel groups formed to include a larger emissive region for blue light emission than for other colors. Blue emissive materials are more sensitive to electrical degradation and typically degrade at a higher rate than emissive materials for other colors. In some instances, the lifetimes of display devices due to electrical degradation of the emissive materials are controlled predominantly by the aging of the blue emissive materials which emit less light and/or require higher operating voltages over their lifetime to achieve a steady luminance. However, the aging of blue emissive materials can be reduced by decreasing the current density through the emissive material. Thus, a tradeoff may be made between display brightness (or emissivity, which correlates with current density) and display aging, which occurs more rapidly at higher current densities. However, by increasing the relative area of the blue emissive region(s), the current density through the blue emissive material can be decreased while achieving substantially the same light output from the blue material. In other words, a large blue emissive region allows the total current through the blue emissive material (and thus the total emissivity) to be the same as for a small blue emissive region, but the current density (which determines aging degradation) through the large region can be less than for the small region. For example, a multi-color pixel group can include red, green, and blue sub-pixels and the blue sub-pixel can include an emission region roughly twice the size of the emission regions for each of the red and green sub-pixels. In such an arrangement, the current density through the blue sub-pixel is approximately half the value it would otherwise be if the blue emission region was the same size as the red and green emission regions. As a result, the total aging degradation of such a display is generally less than displays with equal sized emissive regions for each color, because the aging is not dominated by the degradation of the blue material.

Figure 1B:
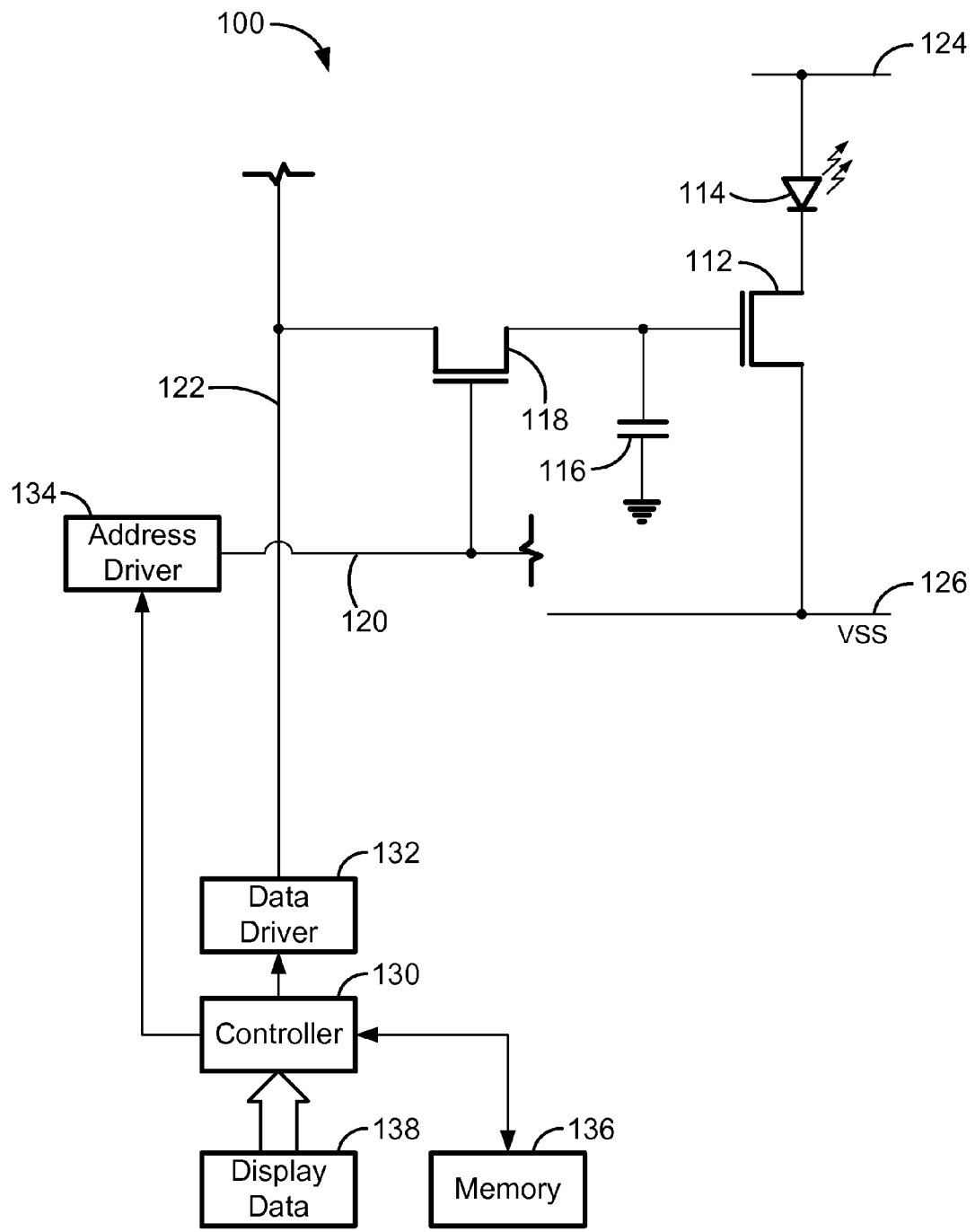
FIG. 1B is a circuit diagram of a representative driving circuit in the TFT backplane for a pixel in an active matrix display including a storage capacitor and a drive transistor for conveying current through the emission region according to charge on the storage capacitor.

FIG. 1B is a circuit diagram of a representative pixel circuit 100 in the TFT backplane 20 for a pixel in an active matrix display including a storage capacitor 116 and a drive transistor 112 for conveying current through the emission region according to charge on the storage capacitor 116. The pixel circuit 100 is connected to a data line 122, a select line 120, and first and second power supply lines 124, 126. A controller 130 receives display data 138 (such as a video stream, etc.) indicating an amount of luminance to be emitted from the pixel circuit 100. The controller 130 operates a data driver 132 and an address driver 134 to program the pixel circuit 100 according to the received display data 138 during a programming cycle, and allow the pixel circuit 100 to emit light during an emission cycle. During the programming cycle for the pixel circuit 100, the address driver 134 sets the select line 120 to turn on the switch transistor 118 such that the data line 122 is connected to the storage capacitor 116 via the switch transistor 118. Programming information is conveyed to the pixel circuit 100 to charge the storage capacitor 116 via the data line 122. The storage capacitor 116 is desirably arranged such that the drive transistor 112 is driven during the emission cycle according to a charge developed on the storage capacitor 116 during the programming cycle. As shown in FIG. 1B, the storage capacitor 116 can be connected between a gate terminal of the drive transistor 112 and a stable voltage, such as a ground voltage, reference voltage, etc., sufficient to allow the storage capacitor 116 to be charged according to the programming voltage. In some examples, the storage capacitor can be connected between the gate and/or source terminals of the drive transistor 112 such that the charge established on the storage capacitor 116 influences the conductance of the channel region of the drive transistor 112. Thus, setting charging the voltage on the storage capacitor 116 thereby controls the current conveyed through the drive transistor 112 (and through the OLED 114) according to the current-voltage characteristics of the drive transistor 112.

To initiate programming in the pixel circuit 100, the address driver 134 operates a select line 120 to turn on a switch transistor 118. For example, the address driver 134 can set the select line 120 high to turn on the switch transistor 118 and thereby connect the pixel circuit to the data line 122. The data line 122 is set to an appropriate programming voltage based on the display data 138 via the data driver 132. The programming voltage can optionally be adjusted to account for aging degradation according to information in the memory 136. The programming voltage on the data line 122 is conveyed, via the switch transistor 118, to a storage capacitor 116 which is connected to the gate of a drive transistor 112. The storage capacitor 116 is connected to a ground voltage at a terminal opposite the one connected to the gate of the drive transistor 112, to thereby situate the storage capacitor to be charged according to the difference between the programming voltage and the ground voltage. However, it is specifically noted that the storage capacitor 116 can also be connected to another stable voltage suitable for allowing the storage capacitor 116 to be charged according to the programming voltage, such as, for example, a power supply voltage line (e.g., Vdd or Vss), a terminal of an OLED, or another terminal sufficient to prevent the storage capacitor 116 from floating during programming. The drive transistor 112 is connected in series with a light emitting device 114, which can be an OLED, for example. The drive transistor 112 and light emitting device 114 series is connected between first and second power supply lines Vdd 124 and Vss 126. The power supply lines Vdd 124 and Vss 126 can provide fixed voltages or can optionally be dynamically adjusted. For example, one or both of the power supply lines 124, 126 can be adjusted to a value sufficient to reverse bias the light emitting device 114 during a programming cycle to thereby prevent emission from the light emitting device 114 during the programming cycle while the light emitting device 114 is being programmed.

Thus, the pixel circuit 100 can be operated to emit light according to programming information by turning on the switch transistor 118, via the address driver 134, while a suitable programming voltage is established on the storage capacitor 116, via the data driver 132. The switch transistor 118 is then turned off and the voltage on the storage capacitor 116 controls gate-source voltage of the drive transistor by setting the voltage on the gate of the drive transistor 112. Because the conductance of the channel region of the drive transistor 112 is influenced by its gate-source voltage (e.g., according to the current-voltage characteristics of the drive transistor 112), the current level through the drive transistor 112 is determined by the charge on the storage capacitor 116. Furthermore, because the emissivity of the light emitting device 114 is established by the current flowing through the light emitting device 114, the light output from the pixel circuit 100 is controlled according to the voltage on the storage capacitor 116 during the driving cycle.

In some examples, the data driver 132 can set the data line 122 to a programming voltage, which allows the storage capacitor 116 to be charged according to the programming voltage. In other examples, the data line 122 can optionally convey programming currents and the pixel circuit 100 can be arranged to allow the storage capacitor 116 to be charge according to a voltage sufficient to maintain the programming current (or a current related to the programming current) through the drive transistor 112 or another transistor such as a mirror transistor.

Figure 1C:
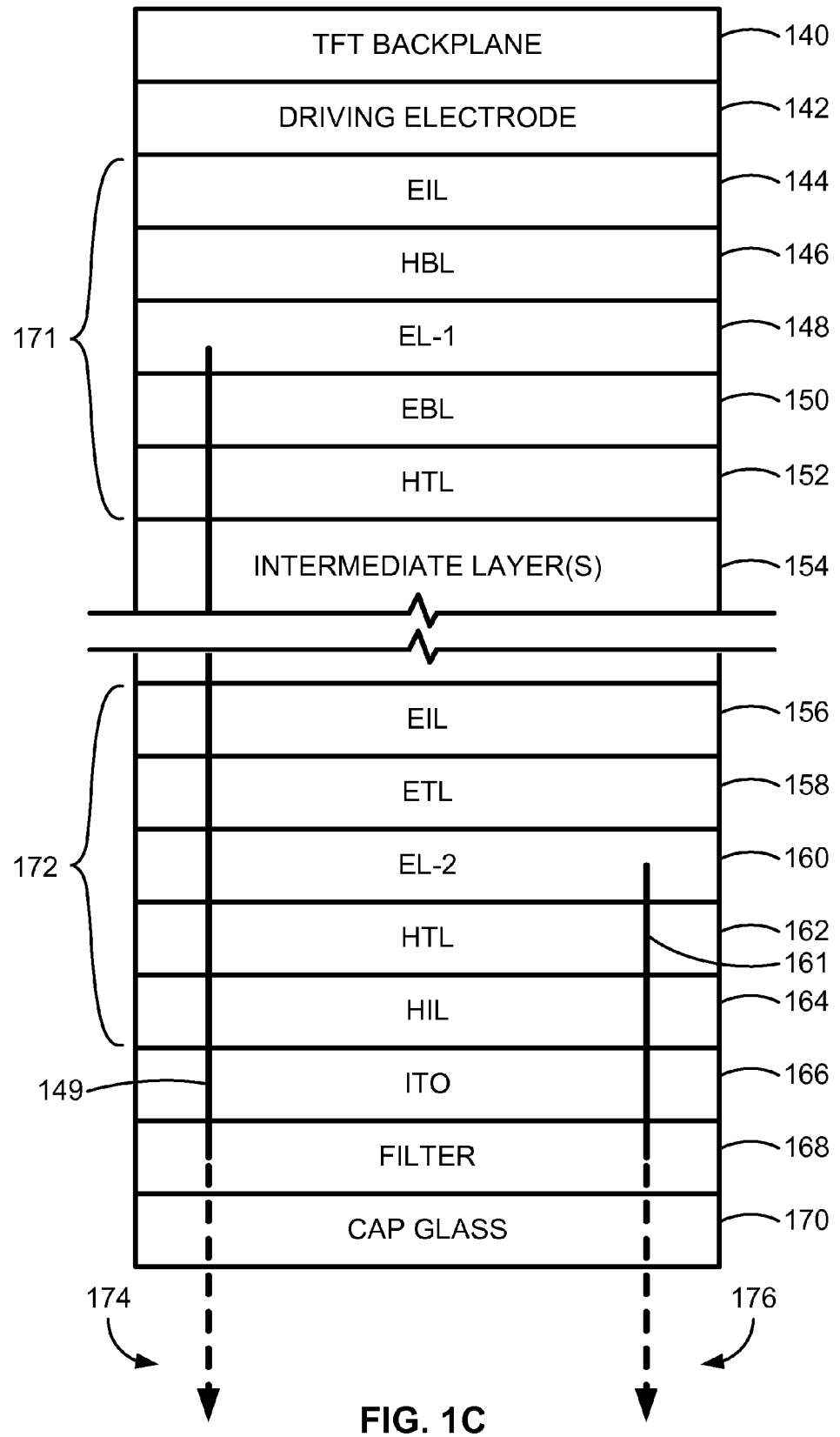
FIG. 1C is a side view of an emissive region for a single pixel including stacked emissive layers and a color filter.

In some pixel architectures disclosed herein, the pixel circuits can include a stacked ("layered") region forming one or more OLEDs and including more than one distinct emissive layer emitting light according to the current passing through each layer (such as in FIGS. 2A-2E). FIG. 1C is a side view of an exemplary emissive region for a single pixel including stacked emissive layers and a color filter provided for illustrative purposes. The stacked region shown in FIG. 1C can be considered two OLEDs 171, 172 connected in series between a driving electrode 142 and a power supply line 166. The power supply line 166 can be a transparent conductive material such as indium tin oxide (ITO) arranged on or near the encapsulation substrate 170. Each OLED 171, 172 includes a cathode (the electron injection layers 144, 156 (EILs)) and an anode (the hole transport layer 152 and hole injection layer 164).

The driving electrode 142 is situated on a TFT backplane 140. The driving electrode 142 can be similar to the electrodes ("terminals") of the TFT backplane 20 in FIG. 1A (e.g., the terminals 22$r,g,b$ of the first pixel group). The driving electrode 142 is connected in series with a driving transistor for a pixel circuit within the TFT backplane such that current conveyed via the driving electrode 142 is controlled by the pixel circuit. For example, with reference to the pixel circuit 100 of FIG. 1B, the driving electrode 142 can be connected to the drain terminal of the driving transistor 112. Referring again to FIG. 1C, the electron injection layer (EIL) 144 is situated on the driving electrode 142. The EIL 144 can generally be formed from a material including a conductive metal with a relatively high work function suitable for providing free electrons to the OLEDs 171, 172, such as, for example, aluminum, gold, etc. The EIL 144 can also be a reflective material such that light emitted from one or both of the OLEDs 171, 172 is redirected toward the cap glass 170. The EIL 144 can also be considered the cathode terminal of the OLED, and in some embodiments can be integrated with or otherwise combined with the driving electrode 142.

The first OLED 171 includes the EIL 144, a hole blocking layer 146 (HBL), a first emissive layer 148 (EL-1), an electron blocking layer 150 (EBL), and a hole transport layer 152 (HTL). The HBL 146 is situated over the EIL 144 to prevent positively charged holes from reaching the EIL, where the holes would recombine with electrons outside of the first emissive layer 148 (EL-1). The EL-1 148 is an organic film with a molecular structure suitable for emitting light 149 with a first color in response to hole-electron recombination events occurring within EL-1 148. The HBL 146 thus increases the efficiency of the first OLED 171 by maximizing the number of recombination events (and thus emission events) that occur within EL-1 148. The EBL similarly increases the efficiency of the first OLED 171 by blocking free electrons from traveling to the HTL 152, to thereby prevent the occurrence of inefficient (i.e., non-light generating) recombination events outside the emissive layer 148.

One or more intermediate layers 154 are provided between the HTL 152 (which is also the anode of the first OLED 171) and the EIL 156 (which is also the cathode of the second OLED 172). The intermediate layers 154 can include substantially transparent and/or semi-transparent materials suitable for conveying positive charged holes traveling from the second OLED 172 to the HTL 152 of the first OLED 171. In some instances, the intermediate layers 154 can include tungsten trioxide, other nitrides and/or oxides, conductive metals, etc.

The second OLED 172 includes the EIL 156, an electron transport layer 158 (ETL), a second emissive layer 160 (EL-2) a hole transport layer 162 (HTL), and the HIL 164. The EIL 156 and HIL 164 define the cathode and anode of the second OLED 172, respectively. The EIL 156 is situated on the intermediate layers 154 and releases free electrons through the ETL 158 toward the emissive layer 160. In some examples, the EIL 156 and the ETL 158 can be combined in a single layer. The EL-2 160 is another organic film with a molecular structure suitable for emitting light 161 with a second color in response to hole-electron recombination events occurring within the EL-2 160. The HTL 162 and the HIL 164 are situated on the EL-2 160 for conveying positively charged holes to the EL-2 160.

Thus, current flowing through the OLEDs 171, 172 results in the generation of the first light 149 in the first emissive layer 148 (EL-1), and the second light 161 from the second emissive layer 160 (EL-2). The generated light 149, 161 is conveyed through the transparent and/or semi-transparent layers, including the power supply line 166 formed of ITO toward the encapsulation glass 170. A color filter 168 is included on one side of the encapsulation glass 170 to allow the generated light 149, 161 to be selectively transmitted according to its color content. For example, the transmission spectrum of the color filter 168 can be such that the transmitted light is substantially red light, green light, or blue light. In one example, the light 149 emitted from EL-1 148 can be blue light while the light 161 emitted from the EL-2 160 can be orange light such that the combined light 149, 161 jointly includes a significant portion of the visible color spectrum and can be considered white light. Thus, the color filter 168 can selectively transmit particular color contributions to the white light (e.g., red, green, blue color contributions). In another example, the light 149 emitted from EL-1 148 can be red light while the light 161 emitted from the EL-2 160 can be blue light and the color filter 168 can be red or blue so as to selectively transmit light from one of the emissive layers (e.g., EL-1 148 or EL-2 160) while largely blocking ("absorbing") light from the other one.

The exemplary emissive region shown in FIG. 1C refers to a pixel circuit arranged to be "top-driven" with current flowing from the power supply line 166, through the OLEDS 171, 172 toward the driving electrode 142 which regulates the current level according to a series-connected driving transistor within the backplane 140. However, aspects of the present disclosure apply to bottom-driven pixel circuits arranged with a driving transistor connected in series with an anode of a layered OLED device, and current flows from the driving electrode, through the OLED, and toward another power supply line. In bottom-driven pixel arrangements, it is also contemplated that the color filters (e.g., the color filters 60 in FIG. 1A) can be applied to the display substrate (e.g., via a lithographic process).

In the following figures and accompanying descriptions, several examples of arrangements ("architectures") for arranging a multi-color pixel group with emissive layers that span multiple terminals and with color filters arranged to filter light from a subset of the pixels in each arrangement. It is specifically contemplated that the pixel groups disclosed herein are can be patterned across a display panel and arranged in rows and columns to allow for independently controlled color content across a display panel to thereby generate color images and/or video. In addition, it is specifically noted that the arrangements and architectures described herein include layouts for emissive regions, driving terminals, and/or color filters, and can be applied to a variety of pixel circuits employing a variety of different programming and driving schemes. In addition, it is specifically understood that additional layers and/or materials can be included between and/or around emissive layers, such as described by way of example in FIG. 1C.

Furthermore, for clarity and consistency of the present disclosure, the arrangements and architectures included herein are described as top-driven pixel circuits situated on a TFT backplane substrate including a pattern of separately controllable driving terminals. However, it is noted that the present disclosure applied to other pixel circuit layouts including bottom-driven arrangements.

FIG. 2A is a top view of a layout 200 for an RGBW multi-color pixel group formed with a substantially continuous strip of blue emissive material 220 on a blue driving terminal 206 and a white driving terminal 208. The RGBW pixel group includes a red pixel R1 defined by the red driving terminal 202, a green pixel G1 defined by a green driving terminal 204, and blue and white pixels (B1 and W1) defined by a blue driving terminal 206 and a white driving terminal 208, respectively. An orange emissive material 222 is distributed in a layer covering all the terminals in the RGBW group. Thus, orange light is produced from the emissive regions for the red and green pixels (R1 and G1) via the orange emissive layer 222. A red filter 212 is situated over R1 to selectively transmit the red content in the emitted orange light, while a green color filter 214 is situated over G1 to selectively transmit the green content in the emitted orange light. A blue filter 216 is situated over B1 to selectively transmit the blue light (emitted via the blue emissive strip 220) while blocking light from the orange layer 222. The white pixel emits substantially all the substantially white light from the combined stack of orange light (via the orange layer 222) and blue light (from the blue layer 220).

In some embodiments of the layout 200, the red, green, blue, and white pixels of the RGBW pixel group each include emissive regions with a similar size and/or area. Generally, the size and/or shape of the emissive region of the pixels in the layout 200 are defined by the size of the corresponding driving terminals (e.g., the driving terminals 202, 204, 206, 208). In some cases the driving terminals 202-208 can each be approximately the same size. For example, the RGBW pixel group can be arranged as a square divided in quadrants and each quadrant can include one of the driving terminals 202-208. Furthermore, each of the driving terminals 202-208 can be a square or rounded square with similar heights and widths, and the color filters 212-216 can be arranged with similar dimensions to the driving terminals 202-206 so as to filter light from the respective emissive regions of the pixels R1, G1, B1.

Figure 2B:
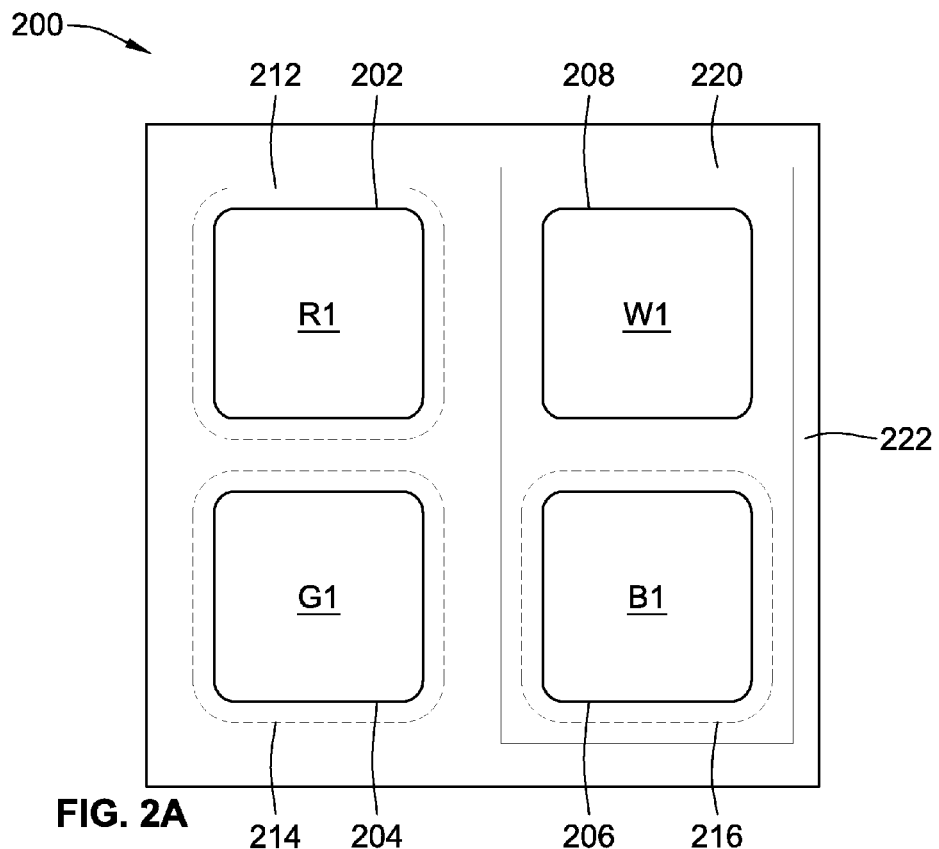
FIG. 2B is an aspect view of the RGBW multi-color pixel group layout with the strip of blue emissive material formed over a layer of orange emissive material.

FIG. 2B is an aspect view of the RGBW multi-color pixel group layout 200 with the strip of blue emissive material 220 formed over a layer of orange emissive material 222. In some embodiments, a display panel formed with pattern of pixels arranged according to the layout 200 can be formed by depositing ("developing") the orange emissive layer 222 in a substantially uniform, continuous layer across the display panel. Following the development of the orange layer 222, any desired intermediate layers can be situated, and a shadow mask can be aligned with an elongated opening over the blue and white pixels B1, W1. For example, the elongated opening can extend across multiple such pixel groups in a continuous line of adjacent alternating blue and white pixels in multiple RGBW pixel groups. The blue emissive layer 220 can be deposited in the desired region while the shadow mask blocks the blue emissive material from the red and green pixels R1, G1. Additional layers and/or conductive power supply lines can be arranged on the emissive regions of the display panel and the color filters can then be arranged such that the desired colors are transmitted from each of the red, green, blue, and white pixels in each group. As previously noted, a lithographic process can be employed to apply appropriate color-selective filtering materials (e.g., the color filters 212, 214, 216) to the display substrate and/or encapsulation substrate.

Figure 2C:
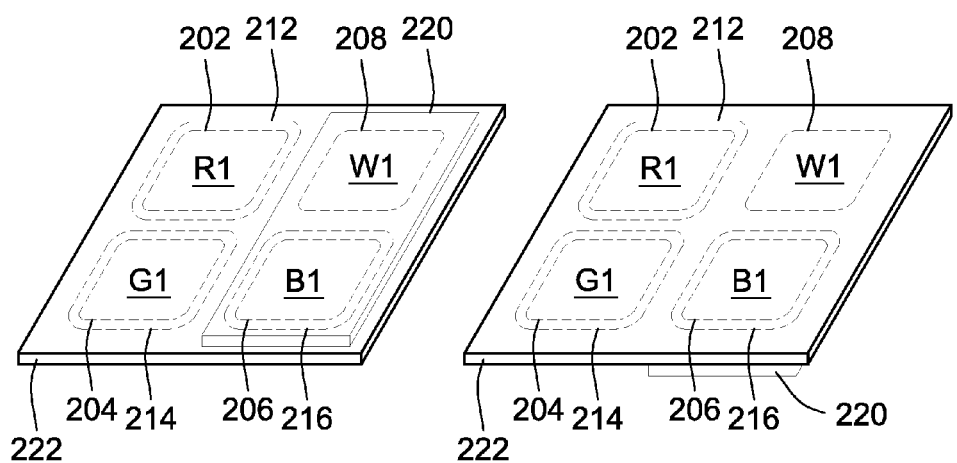
FIG. 2C is an aspect view of the RGBW multi-color pixel group layout with the layer of orange emissive material formed over the strip of blue emissive material.

FIG. 2C is an aspect view of the RGBW multi-color pixel group layout 200 with the layer of orange emissive material 222 formed over the strip of blue emissive material 220. In an exemplary process to construct a display panel with RGBW pixel group layout 200, a shadow mask is situated with an elongated opening over blue and white terminals for multiple pixels and the blue emissive material 220 is deposited in a substantially continuous layer in the region defined by the shadow mask opening. Intermediate layers are situated as desired and the entire display panel is coated with a substantially continuous layer of the orange emissive material 222. The color filters 212, 214, 216 are arranged over the red, green, and blue pixels (R1, G1, B1) to selectively transmit red, green, and blue light. Thus, the layout 200 of FIG. 2A can be achieved without regard to the order of the orange and blue emissive materials 222, 220 in the stacked emissive regions of the blue pixel B1 and white pixel W1.

Figure 2D:
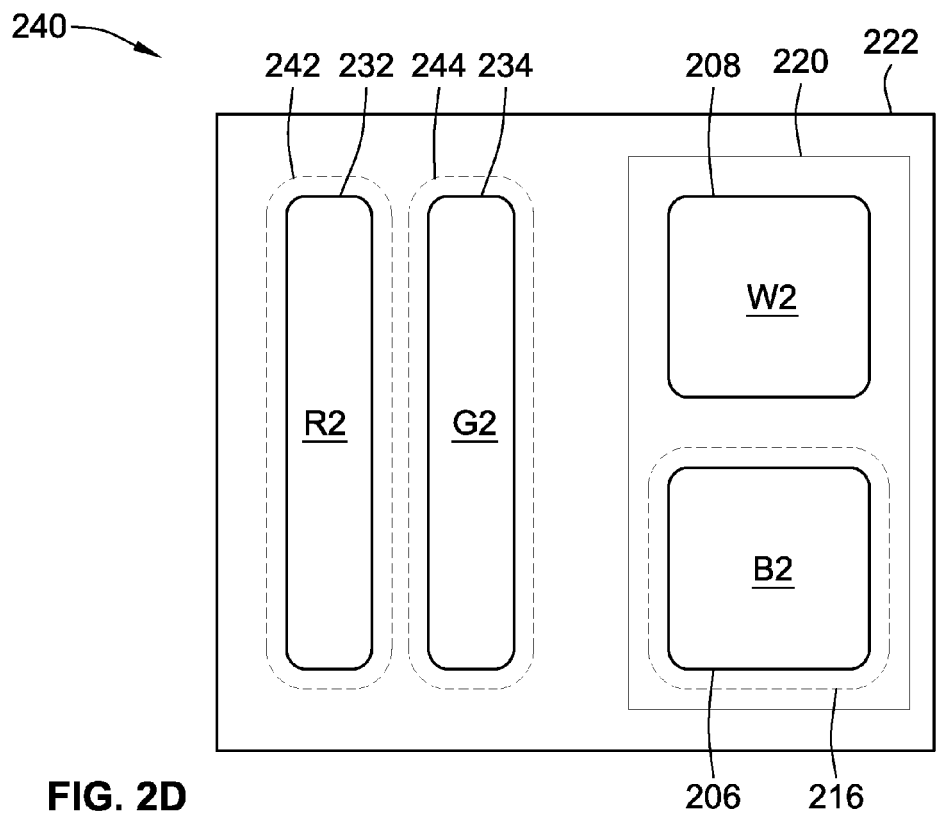
FIG. 2D is a top view of an alternative configuration of the RGBW multi-color pixel group with the red and green sub-pixels having elongated emissive regions.

FIG. 2D is a top view of an alternative configuration of the RGBW multi-color pixel group layout 240 with a red pixel R2 and a green pixel G2 each having elongated emissive regions. The emissive materials 220, 222 in the RGBW pixel group 240 are arranged similarly to the emissive layers in the RGBW pixel group 200 in FIGS. 2A-2C, with the orange emissive material 222 distributed in a substantially continuous layer across all pixels in the group, and a strip of blue emissive material 220 over the blue terminal 206 and the white terminal 208. Thus, the blue pixel B2 and the white pixel W2 are arranged similarly to the pixels B1 and W1 in the pixel group layout 200. However, the arrangement of the red driving terminal 232 and the green driving terminal 234 differs from the RGBW pixel group layout 200. As shown in FIG. 2D, the RGBW pixel group layout 240 is arranged roughly as a square with approximately equal width and height. The driving terminals for the red and green pixels 232, 234 are each arranged as rectangles with a length spanning (or nearly spanning) the height dimension of the RGBW pixel group 240. The width of the terminals 232, 234 is approximately one quarter the width of the RGBW pixel group layout 240. In some embodiments, the elongated driving terminals 232, 234 can have approximately the same surface area as the terminals 202, 204 arranged approximately as squares in quadrants of the square-shaped multi-color pixel group layout 200.

A red color filter 242 is situated to selectively transmit the red light from the orange emissive layer 222 receiving current from the red driving terminal 232. Similarly, a green color filter 244 is situated to selectively transmit the green light from the orange emissive layer 222 receiving current from the green driving terminal 232. The dimensions, size, and/or shape of the color filters 242, 244 can be selected to correspond to the dimensions, size, and/or shape of the respective driving terminals 232, 234. In some examples, the color filters 242, 244 can be larger than their corresponding driving terminals 232, 234 to allow the color filters 242, 244 to completely overlap the emissive regions of the pixels R2, G2, while allowing for some alignment tolerance in positioning the color filters 242, 244 with respect to the pixels R2, G2 (and their respective driving terminals 232, 234).

While the present disclosure includes two specific arrangements for the red and green pixels with R1, G1 approximately arranged as squares in quadrants of the layout 200 (FIG. 2A) and R2, G2 approximately arranged as adjacent rectangles extending the length of the pixel group layout 240 (FIG. 2D), the present disclosure extends to other arrangements. Generally, the driving terminals for the red and green pixels can be arranged to divide a portion of a multi-color pixel group that includes a layer of orange emissive material into distinct areas that are separately programmed and driven to emit light. Red and green color filters are situated in regions corresponding to the driving terminals such that red light is selectively transmitted from one pixel and green light is selectively transmitted from the other pixel, and the shape of the color filters can be a shape that is based on the shape of the driving terminals. The red and green color filters are situated over the portions of the orange emissive material driven by the independently programmed driving terminals such that the transmitted light from each pixel circuit is substantially red and green, respectively.

Figure 2E:
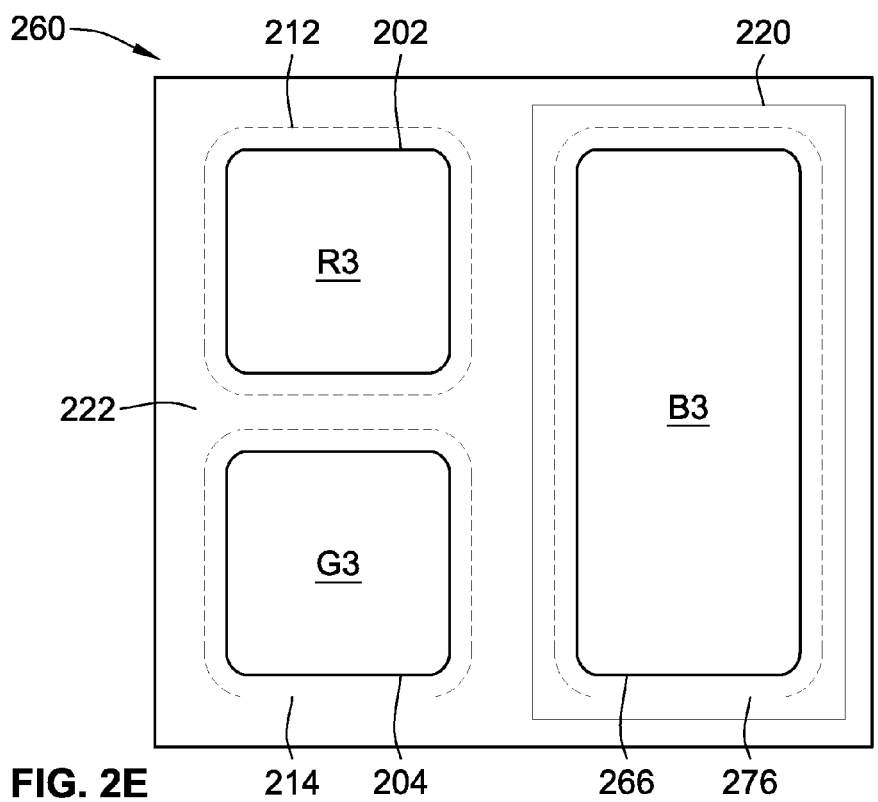
FIG. 2E is a top view of a layout for an RGB multi-color pixel group including emissive layers arranged similarly to the layouts of FIGS. 2A and 2D.

FIG. 2E is a top view of a layout for an RGB multi-color pixel group layout 260 including emissive layers 220, 222 arranged similarly to the layouts of FIGS. 2A and 2D. The arrangement of the RGB pixel group 260 includes red, green, and blue pixels (R3, G3, and B3). The red pixel R3 and green pixel G3 pixels are arranged similarly to the red and green pixels R1, G1 in the RGBW layout 200, with the red and green pixels each arranged as a separately programmed quadrant of the square-shaped pixel group layout 260. The blue pixel B3 includes a blue driving terminal 266 that conveys current through the stacked emissive region including the strip of blue emissive material 220 and the orange emissive material 222. A blue color filter 276 is situated to cover the blue pixel B3 such that the light from the blue emissive material 220 is transmitted while the orange light from the orange emissive material 222 is blocked. Where a display panel is formed by patterning the layout 260 across a panel, adjacent blue pixels from multiple RGB pixel groups can be arranged in a continuous column (or row) of the panel, and the blue color filtering material can be applied to the strip of blue emissive material 220 across its entire length (or nearly entire length).

The blue driving terminal 266 spans roughly one-half of the square-shaped pixel group layout 260. The blue pixel B3 has a larger emissive region (as measured by area) than the emissive regions of either the red or green pixels R3, G3. Thus, blue light is emitted from approximately one-half of the pixel group, rather than approximately one-fourth, as in the pixel group layouts 200, 240 of FIGS. 2A-2D. Furthermore, a display panel patterned according to the layout 260, transmits blue light from roughly half (or nearly half) of the display area of the panel, similar to the display panel 10 of FIG. 1A. Similar to the discussion of the relative sizes of the blue pixel areas in connection with FIG. 1A, providing a layout (e.g., the layout 260) with an increased relative size of the blue pixel allows for decreasing the current density through the strip of blue emissive material 220 without loss of display brightness and thereby allows for decreasing the aging degradation of the display panel.

Figure 3A:
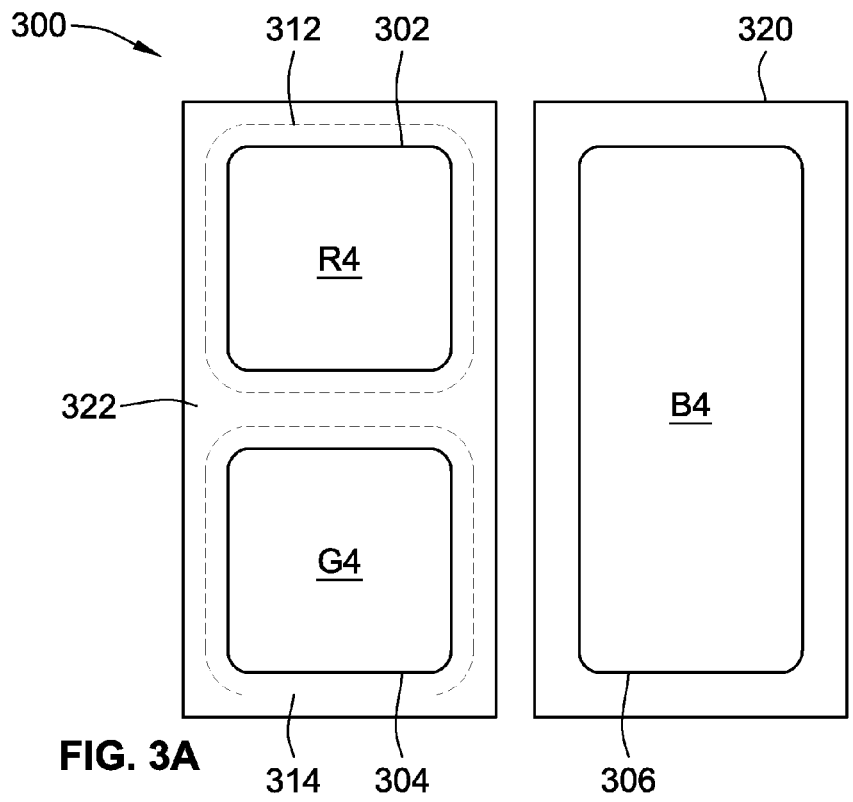
FIG. 3A is a top view of a layout for an RGB multi-color pixel group formed from alternating strips of orange and blue emissive material and with a blue sub-pixel enlarged relative to red and green sub-pixels.

FIG. 3A is a top view of a layout 300 for an RGB multi-color pixel group formed from alternating strips of orange emissive material 322 and blue emissive material 320 and with a blue sub-pixel B4 enlarged relative to red and green sub-pixels (R4, G4). The red pixel R4 includes a red driving terminal 302; the green pixel G4 includes a green driving terminal 304; and the blue pixel B4 includes a blue driving terminal 306. The arrangement of the driving terminals 302-306 in the RGB pixel group 300 of FIG. 3A is similar to the driving terminal arrangement in the layout 260 of FIG. 3A. Generally, the RGB pixel group of FIG. 3A is arranged as a square with the red pixel R4 and green pixel G4 each occupying roughly one quadrant of the square, and the blue pixel B4 occupying roughly the remaining half of the square. The strip of orange emissive material 322 is a substantially continuous layer that covers the driving terminals 312, 314 of the red and green pixels (R4, G4). A red color filter 312 and a green color filter 314 are situated over the portions of the orange emissive material 322 driven by the red driving terminal 302 and the green driving terminal 304, respectively. Thus, the RGB pixel group 300 transmits red light from the red pixel R4, green light from the green pixel G4, and unfiltered blue light is emitted from the blue pixel B4. As described previously, the relatively large size of the blue pixel B4 in comparison to the red and green pixels (R4, G4) reduces degradation associated with the blue emissive material 320 by reducing the current density through the blue emissive material. The layout 300 of the RGB pixel group in FIG. 3A is similar to the layouts of the multi-color pixel groups 22, 24 of FIG. 1A.

Figure 3B:
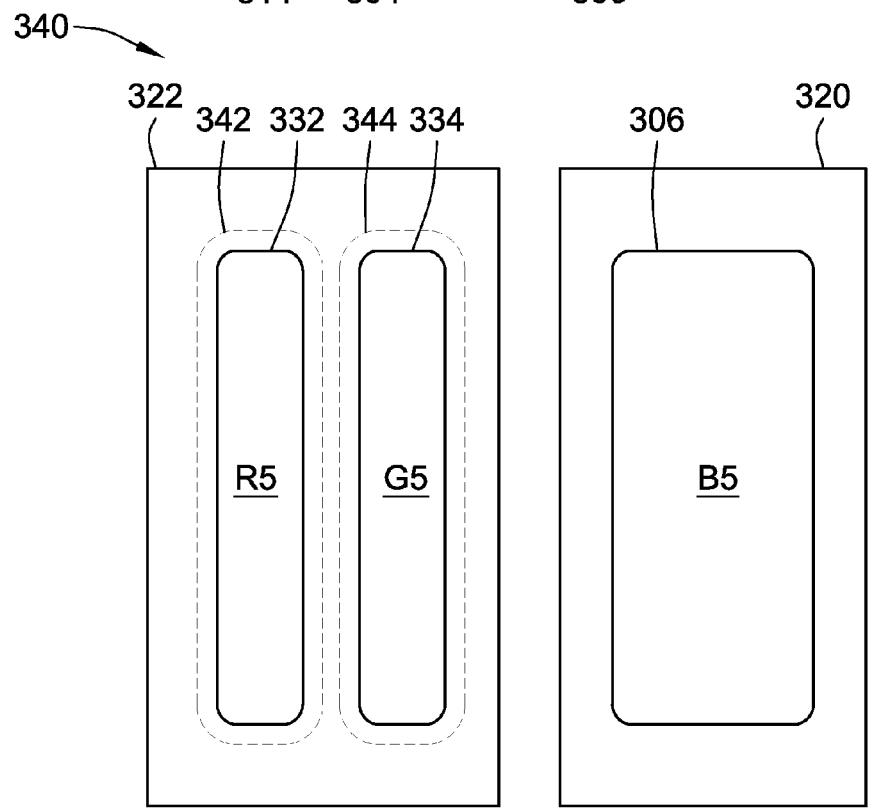
FIG. 3B is a top view of a layout for an RGB multi-color pixel group similar to the layout in FIG. 3A, but where the red and green sub-pixels have elongated emissive regions.

FIG. 3B is a top view of a layout 340 for an RGB multi-color pixel group similar to the layout 300 in FIG. 3A, but where the red and green sub-pixels (R5, G5) have elongated emissive regions. The RGB pixel group is roughly arranged as a square, and the blue pixel B5 occupies roughly half of the square, similar to the blue pixel B4 in FIG. 3A. However, in the layout 340, a red driving terminal 332 and a green driving terminal 334 are arranged as adjacent rectangles that jointly span roughly half of the square-shaped pixel group. The rectangular red and green driving terminals 332, 334 can have lengths roughly spanning the height of the square-shaped pixel group, and with widths roughly spanning one-quarter the width of the square-shaped pixel group. A red color filter 342 and a green color filter 334 are situated over the portions of the orange emissive material 322 driven by the red driving terminal 332 and the green driving terminal 334, respectively. In some examples, the layout 340 is preferred over the layout 300 of FIG. 3A, because the layout 340 situates all three pixels R5, G5, B5 of the multi-color pixel group in a single row, rather that splitting the red and green pixels across two rows (pixels R4, G4 of FIG. 3A). In some embodiments, arranging all the pixels R5, G5, B5 in a single row as in the layout 340 can allow for less redundancy and more uniform spacing in selection, addressing, programming, and/or power supply lines in the TFT backplane.

In comparison to the arrangements in FIGS. 2A-2E, the RGB pixel group layouts 300, 340 of FIGS. 3A-3B do not include blue color filters, because the blue pixels B4, B5 include only blue emissive material and are not stacked emissive regions also including orange emissive material. Display panels formed by patterning either of the layouts 300, 340 can thus be operated at a higher energy efficiency than the displays arranged according to the layouts 200, 240, 260 of FIGS. 2A-2E, because less light is filtered (i.e., wasted).

FIG. 4A is another top view of a layout 400 for RGB multi-color pixel groups formed from alternating strips of orange emissive material 420, 424 and blue emissive material 422 and with adjacent blue pixels being associated with red and green sub-pixels in alternating upper and lower rows. Thus, a first RGB pixel group includes a red pixel R6, a green pixel G6, and a blue pixel B6. A second RGB pixel group includes a red pixel R7, a green pixel G7, and a blue pixel B7. The red pixel R6 and the green pixel G6 include a common, substantially continuous strip of orange emissive material 420 that spans respective driving terminals 402, 404 for the red and green pixels R6, G6. A red filter 412 selectively transmits red light from the red pixel R6 while a green filter 414 selectively transmits green light from the green pixel G6. Similarly, the red pixel R7 and the green pixel G7 include a common, substantially continuous strip of orange emissive material 424 that spans respective driving terminals 432, 434 for the red and green pixels R7, G7. A red filter 442 selectively transmits red light from the red pixel R7 while a green filter 444 selectively transmits green light from the green pixel G7. The blue pixels B6, B7 include a common, substantially continuous strip of blue emissive material 422 that spans respective driving terminals 406, 436 for the blue pixels B6, B7. The blue pixels B6, B7 are situated between the adjacent red and green pixels R6, G6 in the first RGB pixel group and the adjacent red and green pixels R7, G7 in the second RGB pixel group.

The substantially continuous strips of orange emissive material 420 can be developed by placing a shadow mask with an elongated opening aligned over an area including the driving terminals 402, 404 for the red and green pixels R6, G6 and depositing the orange emissive material 420 to form the substantially continuous strip with roughly uniform thickness while preventing the orange emissive material 420 from reaching the emissive regions for the blue pixels B6, B7. The elongated opening of the shadow mask (and thus the substantially continuous layer 420) can optionally extend to span multiple alternating adjacent red and green pixels from additional RGB pixel groups (not shown). Further, the shadow mask can be arranged with an additional elongated opening aligned over an area including the driving terminals 432, 434 for the red and green pixels R7, G7. Alternatively, the strip of orange emissive material 424 can be developed via a separate shadow mask.

Before and/or after the strips of orange emissive materials 420, 424, another shadow mask is placed over the display panel with an elongated opening in the shadow mask aligned over an area including the driving terminals 406, 436 of the blue pixels B6, B7. The elongated opening in the shadow mask can extend to include emissive regions for additional blue pixels in the display panel such that the strip of blue emissive material 422 spans an area including multiple blue pixels and has a substantially constant thickness across the area. The shadow mask used to develop the strip of blue emissive material 422 can optionally be the same as the one used for the red and green pixels, but repositioned to align its elongated opening with the blue pixels B6, B7 while covering the red and green pixels R6, G6, R7, G7.

The red and green pixels R6, G6 of the first RGB pixel group can be adjacent pixels in a first row of a display panel. The blue pixels B6, B7 of the first and second RGB pixel groups can be adjacent pixels in a second row immediately above or below the red and green pixels R6, G6 of the first group. The red and green pixels R7, G7 of the second RGB pixel group can be adjacent pixels in a third row immediately adjacent the second row. Thus, the first and second pixel groups can span two columns and three rows of a display panel. Alternatively, the layout can be rotated by 90 degrees such that the two pixel groups include three columns and two rows.

In some examples of the layout 400, each of the pixels R6-B6 and R7-B7 can have an approximately equal area and have approximately equally sized driving terminals. For example, the two pixel groups can be arranged as a rectangle divided into six approximately equally-sized squares arranged in a 2 by 3 array, with the upper two squares occupied by the red and green pixels R6, G6, the middle two squares occupied by the blue pixels B6, B7 and the lower two squares occupied by the red and green pixels R7, G7.

Figure 4B:
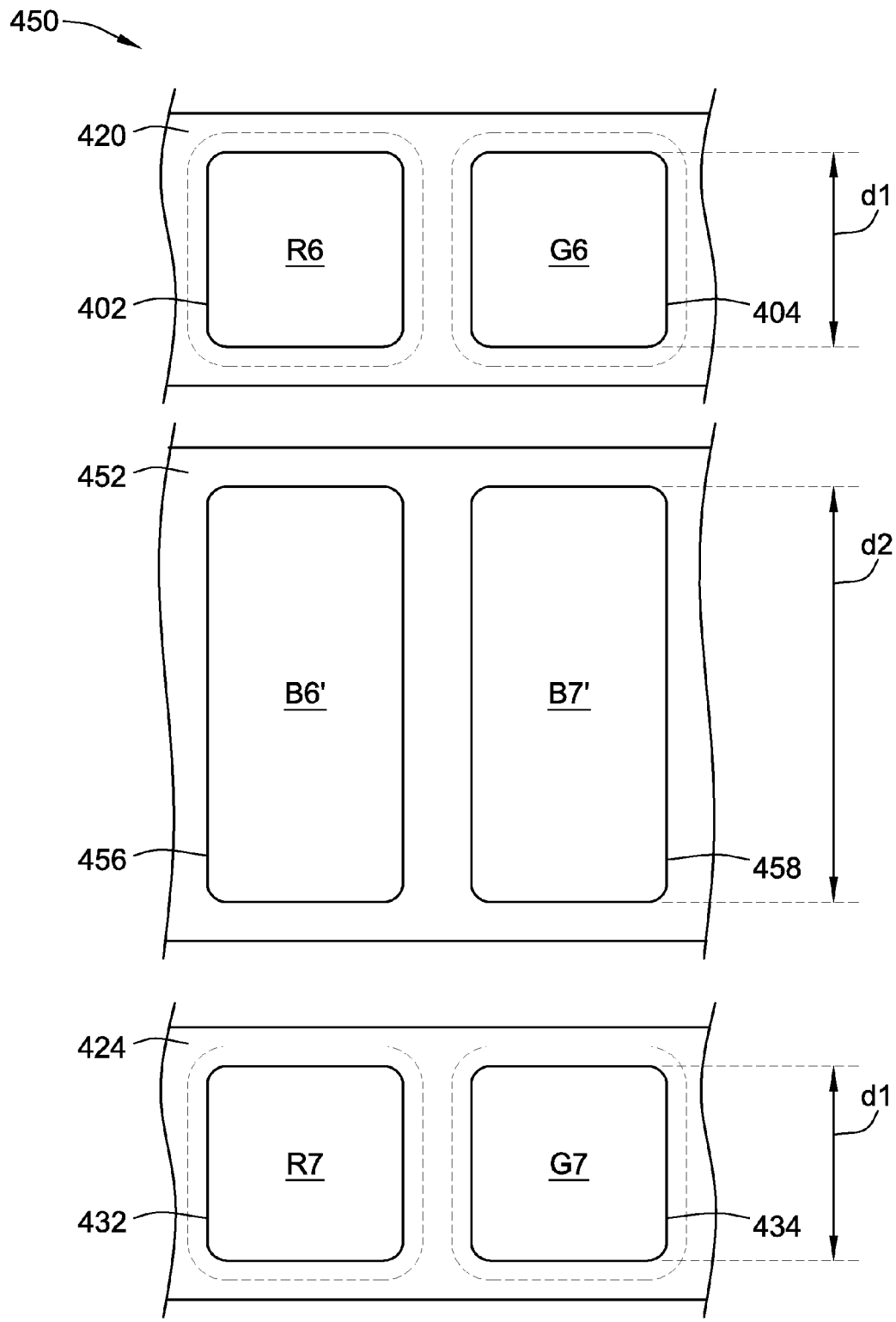
FIG. 4B is a top view of a layout for an RGB multi-color pixel group similar to the layout of FIG. 4A, but where the blue subpixels in each RGB multi-color pixel group have a larger area than either the red or green subpixels.

FIG. 4B is a top view of a layout 450 for an RGB multi-color pixel group similar to the layout of FIG. 4A, but where the blue pixels B6', B7' in each RGB multi-color pixel group have a larger area than either the red or green pixels R6, G6, R7, G7. As shown in the layout 450, a blue emissive layer 452 is provided in a substantially continuous strip that includes the blue pixels B6', B7'. The blue pixels B6', B7' are driven via driving terminals 456, 458 that are separately programmed and driven to cause the blue emissive layer to emit light according to independently determined luminance values. Thus, the driving terminals 456, 458 define respective portions of the substantially continuous strip of blue emissive material 452 included in the blue pixel B6' for the first RGB pixel group and the blue pixel B7' for the second RGB pixel group, respectively.

The red and green pixels R6, G6, R7, G7 are each roughly as squares of dimension d1. The blue pixels B6', B7' are each arranged as rectangles with a width approximately given by the widths of the red and green pixels R6, G6, R7, G7 (e.g., d1) and a height given by d2, which is larger than d1. Thus, the areas of the two blue pixels B6', B7' are each larger than the areas of the red and green pixels R6, G6, R7, G7. The width of the strip of blue emissive material 452 is larger than d2 to allow for an alignment tolerance while still achieving nearly complete coverage of the driving terminals 456, 458 of the blue pixels B6', B7'. In an example, d2 can be approximately twice d1 such that the emissive region of each of the blue pixels B6', B7' is roughly twice the area of the emissive regions of each of the red and green pixels R6, G6, R7, G7.

When patterning a display panel according to the layout 450, the red and green pixels R6, G6 can be immediately below another pair of red and green pixels for another RGB pixel group (not shown), and the orange emissive layer 420 can extend, along the width of the strip, to cover the other pair of red and green pixels. In some instances, the width dimensions of the alternating strips of orange and blue emissive material deposited on a display panel can be approximately equal, even where the blue pixels (e.g., B6', B7') are each roughly twice the area of each of the red and green pixels R6, G6, R7, G7, because the strips of orange emissive material (e.g., 420, 424) cover a region of red and green pixels that is two pixels wide (e.g., approximately twice the dimension d1, plus an alignment margin). The region of red and green pixels can be two rows of checkered red and green pixels, alternating adjacent pairs of red and green pixels, or some other regularly repeating pattern of red and green pixels.

Furthermore, while the blue pixels B6', B7' are shown as extended along a vertical dimension d2, such that the blue pixels B6', B7' are included in a single column, the present disclosure also applies to enlarged blue pixels that are rotated with an extended dimension roughly spanning a pair of red and green pixels. For example, the layout 450 can be modified with the blue pixels B6', B7' pixels each rotated 90 degrees clockwise about an axis located centrally between the two. Thus, the first blue pixel B6' can be situated immediately below the red and green pixels R6, G6 in the first RGB pixel group, and the blue pixel B7' can be situated immediately above the red and green pixels R7, G7 in the second RGB pixel group.

Figure 4C:
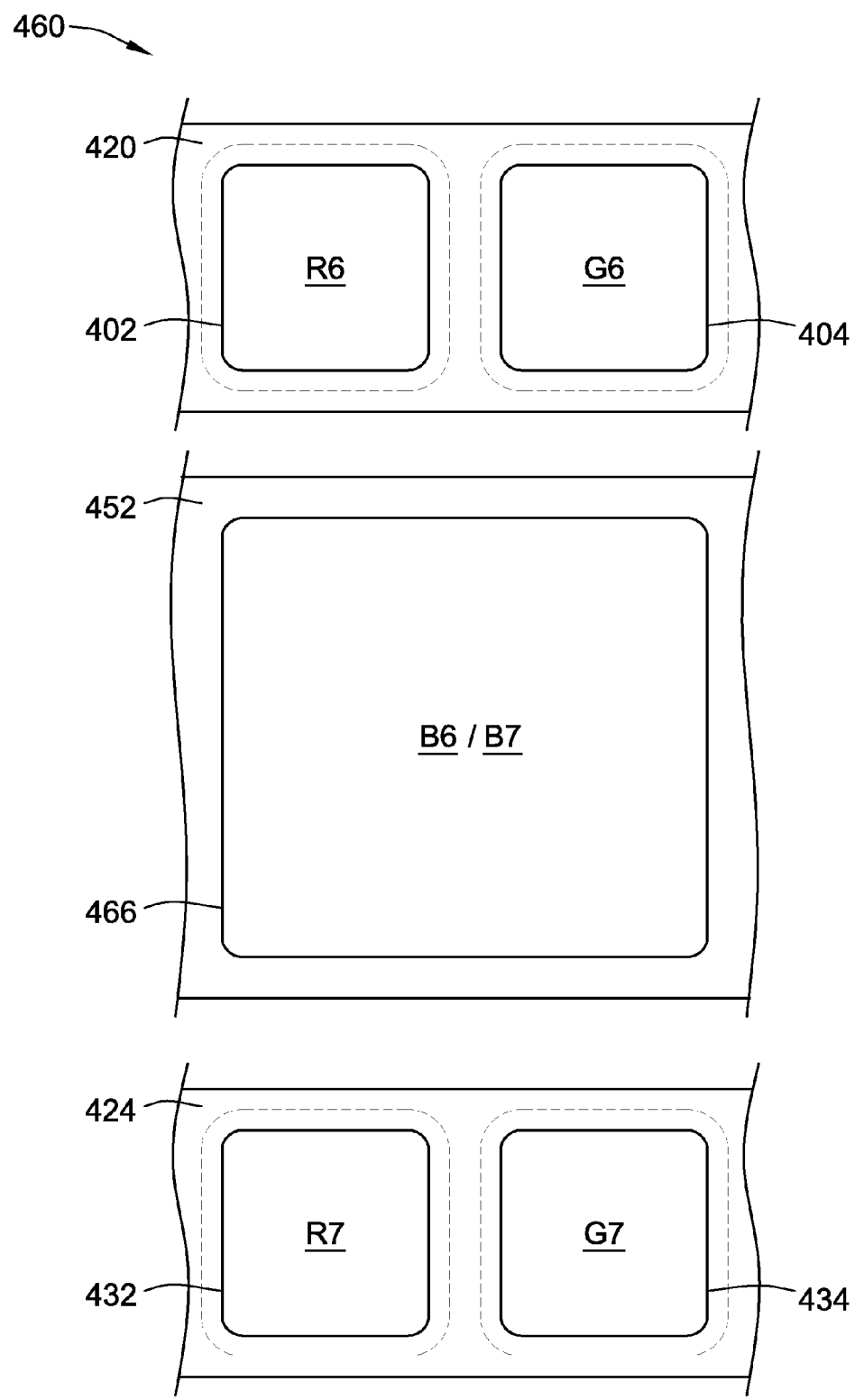
FIG. 4C is a top view of a layout for an RGB multi-color pixel group similar to the layout of FIG. 4B but where adjacent multi-color pixel groups share a common unitary blue subpixel.

FIG. 4C is a top view of a layout 460 for an RGB multi-color pixel group similar to the layout of FIG. 4B but where adjacent multi-color pixel groups share a common unitary blue pixel B6/B7. In the layout 460, the common unitary blue pixel B6/B7 can occupy roughly the same area as the combination of the blue pixels B6', B7' in the layout 450 of FIG. 4B. The common unitary blue pixel B6/B7 includes a single driving terminal 466 that is programmed according to a luminance value based on programming information for the first and second multi-color pixel groups. Thus, in the layout 460, adjacent multi-color pixel groups share a single blue pixel (e.g., the blue pixel B6/B7), while still maintaining the distinct red and green pixels R6, G6, R7, G7. The common blue pixel B6/B7 is driven to emit blue light with a luminance that is based on incoming blue content of a displayed image from the regions of the first and second pixel group. In some examples, the blue pixel B6/B7 can be driven according to an average blue luminance contribution from two adjacent RGB pixels corresponding to the first and second RGB pixel groups in the layout 460.

Figure 4D:
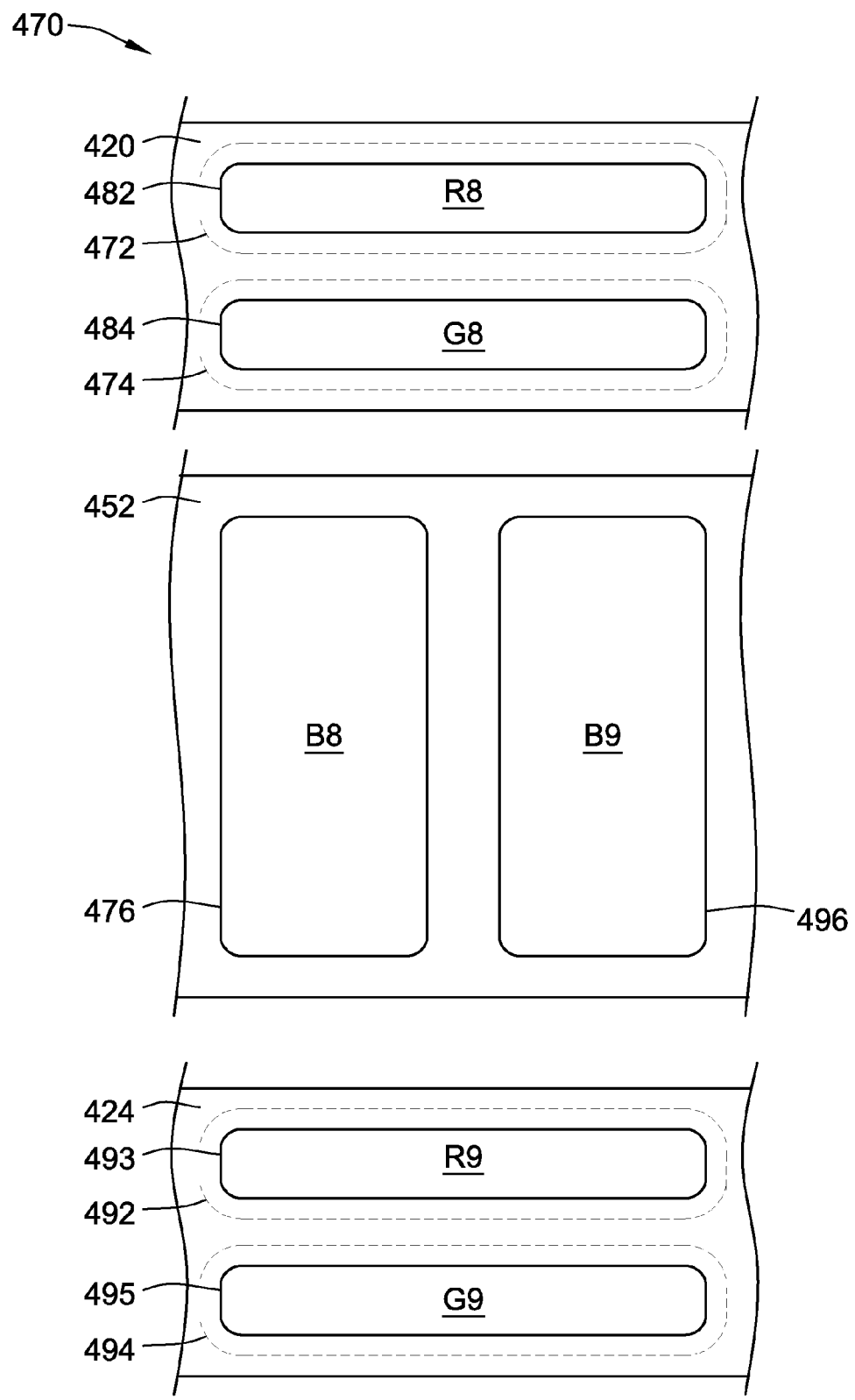
FIG. 4D is a top view of a layout for an RGB multi-color pixel group similar to the layout of FIG. 4B with the red and green sub-pixels having elongated emissive regions.

FIG. 4D is a top view of a layout 470 for an RGB multi-color pixel group similar to the layout 450 of FIG. 4B with the red and green sub-pixels having elongated emissive regions. The alternating strips of orange emissive material 420, 424 and blue emissive material 452 are situated as in the layout 450 shown in FIG. 4B. However, the strips of orange emissive material 420, 424 are divided into red and green pixels (e.g., the pixels R8, G8, R9, G9) by rectangular driving terminals 482, 484, 493, 495 elongated along the extended direction of the strip of orange emissive material 420, 424. The rectangular driving terminals 482, 484, 493, 495 are situated to include two adjacent rows of the red and green pixels in the strip of orange emissive material 420, 424. Red color filters 472, 474 and green color filters 492, 494 are situated to selectively transmit the red content, and green content, respectively, emitted in the strips of orange emissive material 420, 424.

Thus, the rectangular driving terminals 482, 484, 493, 495 are arranged in two adjacent rows of red and green pairs for each RGB pixel group. By contrast, the layout 450 includes alternating red and green square driving terminals in a single row. The red and green pixels R8, G8, R9, G9 have a width spanning the two adjacent blue pixels B8, B9 and a height dimension sufficiently small to allow the strip of orange emissive material 420 to overlap both red and green driving terminals 482, 484. In some examples, the red and green pixels R8, G8, R9, G9 in the layout 470 have a height roughly half that of the red and green pixels R6, G6, R7, G7 in the layout 450 of FIG. 4B, and have a width roughly twice that of the red and green pixels in the layout 450.

FIG. 5 is a top view of a layout 500 for an RGB multi-color pixel group formed from parallel strips of red and green emissive materials 520, 522 overlapped with perpendicularly aligned strips of blue emissive material 524. The layout 500 includes a first RGB pixel group including a red pixel R10, a green pixel G10, and a blue pixel B10. The layout 500 also includes a second RGB pixel group including a red pixel R11, a green pixel G11, and a blue pixel B11. It is noted that the arrangement of the driving terminals in the layout 500 can be the same or similar as the arrangement of driving terminals in the layout 400 of FIG. 4A.

In reference to the layout 500 of FIG. 5, the red pixel R10 is driven by a driving terminal 502 to convey current through the red emissive material 520. The green pixel G10 is driven by a driving terminal 504 to convey current through the green emissive material 522. The blue pixel B10 is driven by a driving terminal 506 to convey current through the red emissive material 520 and the blue emissive material 524, which are arranged in a stacked configuration. The blue pixel B11 is driven by a driving terminal 516 to convey current through the green emissive material 522 and the blue emissive material 524, which are arranged in a stacked configuration.

Generally, the strip of blue emissive material 524 can be situated over or under the red and green emissive materials 520, 522. However, both strips of the red and green emissive material 520, 522 are advantageously on the same side (e.g., over or under) of the blue emissive material 524 to provide efficiency in constructing a display panel including the pattern 500. For example, a process can begin with depositing the strip of red emissive material 520 (or a pattern of such strips) on a display substrate via a shadow mask having an elongated opening aligned to include the emissive region of the red pixels R10, R11 and the blue pixel B10. The shadow mask can then be translated by roughly the dimension of a single pixel such that the elongated opening is aligned to include the emissive region of the green pixels G10, G11 and the blue pixel B11, and the green emissive material 522 can be deposited. To develop the substantially continuous strip of blue emissive material 524 oriented perpendicularly to the two red and green strips 520, 522, the same shadow mask can be rotated about 90 degrees, or another shadow mask can be positioned over the display substrate with an elongated opening aligned to include the emissive regions of the blue pixels B10, B11, and the blue emissive material 524 can be deposited. Because the translation of the shadow mask while maintaining a parallel orientation of the shadow mask's elongated opening is generally a faster process than either rotating a shadow mask or positioning a different shadow mask, the substantially continuous strips of red and green emissive material 520, 522 are desirably deposited consecutively A blue color filter 508 is situated to selectively transmit the blue content from the light emitted in the blue pixels B10, B11. In some examples, the blue color filter 508 can be applied to continuously span a row of adjacent blue pixels including the blue pixels B10, B11. In reference to the layout 500 of FIG. 5, it is noted that the only pixels in the RGB pixel groups that are filtered are the blue pixels B10, B11, while the red and green pixels emit unfiltered light. The net luminance of a typical display is dominantly provided by red and green color contributions, with blue light contributions providing much less light overall (perhaps as little as 3% in total luminance contributions in a typical display). Furthermore, the human retina is generally more sensitive ("responsive") to red and green light than blue light and so bright images can be perceived while relying primarily on red and green color contributions to a given image. Thus, by filtering the blue pixels, rather than the red or green pixels, there is relatively little light that is wastefully generated only to be blocked by a color filter. Accordingly, the layout 500 provides for a relatively high degree of energy efficiency by filtering only the blue light contributions to the total luminance and emitting the red and green contributions to the total luminance without significant color filters to partially block the light generated in those regions.

Figure 6A:
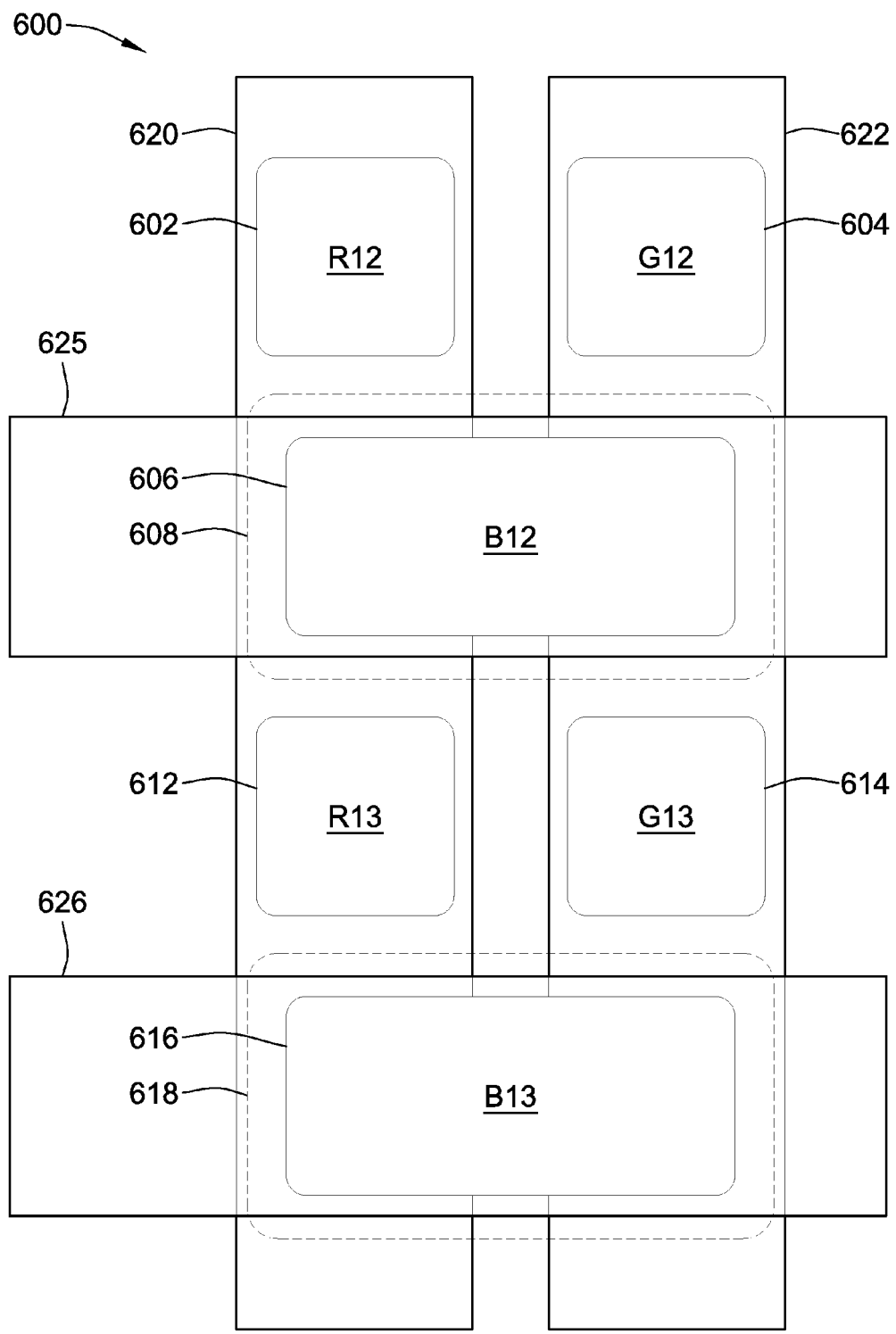
FIG. 6A is a top view of a layout for RGB multi-color pixel groups formed from parallel strips of red and green emissive materials overlapped with perpendicularly aligned strips of blue emissive material with blue sub-pixels enlarged relative to red and green sub-pixels.

FIG. 6A is a top view of a layout 600 for RGB multi-color pixel groups formed from parallel strips of red and green emissive materials 620, 622 overlapped with perpendicularly aligned strips of blue emissive material 625, 626 and with blue pixels B12, B13 enlarged relative to red and green sub-pixels R12, G12, R13, G13. FIG. 6B is an aspect view of the RGB multi-color pixel groups of FIG. 6A showing alignment of the layers of emissive material 620, 622, 624, 626 and color filters 608, 618 with respect to a TFT backplane 630.

In the layout 600, a first RGB pixel group includes a red pixel R12, a green pixel G12, and a blue pixel B12, and a second RGB pixel group includes a red pixel R13, a green pixel G13, and a blue pixel G13. Substantially continuous parallel strips of red emissive material 620 and green emissive material 622 are arranged over the red pixels R12, R13 and green pixels G12, G13, respectively. The strips of red and green emissive material 620, 622 also extend over a portion of the blue pixels B12, B13. A substantially continuous strip of blue emissive material 625 is oriented perpendicularly to the red and green strips 620, 622 and covers the blue pixel B12. Another substantially continuous strip of blue emissive material 626 is also oriented perpendicularly to the red and green strips 620, 622 and covers the blue pixel B13.

In the first RGB pixel group, the red pixel R12 includes a driving terminal 602 for conveying current through the red emissive material 620; the green pixel G12 includes a driving terminal 604 for conveying current through the green emissive material 622; and the blue pixel B12 includes a driving terminal 606 for conveying current through the blue emissive material 625, the red emissive material 620, and the green emissive material 622. A blue color filter 608 is situated to selectively transmit the blue light from the blue pixel B12 (e.g., by blocking the red and green light from the portions of the red and green emissive materials overlapping the driving terminal 606). In the second RGB pixel group, the red pixel R13 includes a driving terminal 612 for conveying current through the red emissive material 620; the green pixel G13 includes a driving terminal 614 for conveying current through the green emissive material 622; and the blue pixel B13 includes a driving terminal 616 for conveying current through the blue emissive material 625, the red emissive material 620, and the green emissive material 622. A blue color filter 608 is situated to selectively transmit the blue light from the blue pixel B12 (e.g., by blocking the red and green light from the portions of the red and green emissive materials overlapping the driving terminal 606). As shown in FIGS. 6A-6B, the first RGB pixel group is roughly arranged as a square with the red and green pixels R12, G12 each occupying roughly one quadrant of the square and the blue pixel B12 approximately occupying the remaining half of the square. Similarly, the second RGB pixel group is roughly arranged as a square with the red and green pixels R13, G13 each occupying roughly one quadrant of the square and the blue pixel B13 approximately occupying the remaining half of the square.

While the arrangement of the overlapping emissive regions in the layout 600 is distinct from other layouts disclosed herein, it is noted that the arrangement of the driving terminals in the layout 600 of FIGS. 6A-6B can be the same or similar to the arrangement of the driving terminals in the layout 300 of FIG. 3A. Thus, the ratio of areas of the display panel occupied by red, green, and blue pixels in a display panel patterned according to the layout 600 can be the same or similar to a display panel patterned according to either the layout 300. Furthermore, the discussions above regarding the relative size ("area") of the blue emissive region with respect to the red and green emissive regions in the layout 300 for the RGB pixel group so as to mitigate the aging degradation of the display also applies to the layout 600 of FIGS. 6A-6B.

High resolution display panels and/or display systems can be constructed according to any of the layouts disclosed herein by patterning the layouts across a display panel to create a regularly repeating pattern of evenly distributed red, green, blue, and/or white emitting pixels that are separately programmed.

Generally, the physical dimensions of the multi-color pixel groups described herein can be selected for a particular implementation once constraints for total display size, and display resolution are known. By way of example, a display size 3 inches wide by 1.69 inches high with a resolution of 1920 by 1080 pixels, each multi-color pixel group is roughly situated in an area given by a square with sides roughly 0.0016 inches (or roughly 40 µm). For the same display size with a resolution of 1280 by 720 pixels, each multi-color pixel group is roughly situated in an area given by a square with sides roughly 0.0023 inches (or roughly 60 µm). Thus, achieving such displays generally require pixel pitch of approximately 40-80 µm, which corresponds to pixel densities approaching, or even exceeding, 300 pixels per inch.

The exemplary layouts disclosed herein are described as oriented along rows and/or columns for purposes of clarity in referring to arranging the layouts on a display panel. However, it is specifically understood that any of the layouts described herein can be rotated by 90 degrees and references to rows/columns described herein therefore apply equally to similar descriptions referring to columns/rows of a display panel.

Circuits disclosed herein generally refer to circuit components being connected or coupled to one another. In many instances, the connections referred to are made via direct connections, i.e., with no circuit elements between the connection points other than conductive lines. Although not always explicitly mentioned, such connections can be made by conductive channels defined on substrates of a display panel such as by conductive transparent oxides deposited between the various connection points. Indium tin oxide is one such conductive transparent oxide. In some instances, the components that are coupled and/or connected may be coupled via capacitive coupling between the points of connection, such that the points of connection are connected in series through a capacitive element. While not directly connected, such capacitively coupled connections still allow the points of connection to influence one another via changes in voltage which are reflected at the other point of connection via the capacitive coupling effects and without a DC bias.

Furthermore, in some instances, the various connections and couplings described herein can be achieved through non-direct connections, with another circuit element between the two points of connection. Generally, the one or more circuit element disposed between the points of connection can be a diode, a resistor, a transistor, a switch, etc. Where connections are non-direct, the voltage and/or current between the two points of connection are sufficiently related, via the connecting circuit elements, to be related such that the two points of connection can influence each another (via voltage changes, current changes, etc.) while still achieving substantially the same functions as described herein. In some examples, voltages and/or current levels may be adjusted to account for additional circuit elements providing non-direct connections, as can be appreciated by individuals skilled in the art of circuit design.

Any of the circuits disclosed herein can be fabricated according to many different fabrication technologies, including for example, poly-silicon, amorphous silicon, organic semiconductor, metal oxide, and conventional CMOS. Any of the circuits disclosed herein can be modified by their complementary circuit architecture counterpart (e.g., n-type transistors can be converted to p-type transistors and vice versa).

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:
1. A high resolution display panel comprising:
 a display substrate including at least first and second substantially continuous emissive layers that are common to multiple pixels along the lengths of said layers, said first and second emissive layers having different colors, each of said pixels including a first driving terminal aligned with a segment of said first emissive layer to form a first sub-pixel producing light of a first color in response to current being conveyed through said first emissive layer from said first driving terminal, second and third driving terminals aligned with different portions of said second emissive layer and located on a first side of said second emissive layer to form second and third sub-pixels producing light of a second color in response to current being conveyed through said second emissive layer from said second and third driving terminals, and first and second color filters aligned with said second and third driving terminals and located on the opposite side of said second emissive layer from said second and third driving terminals to produce light of third and fourth colors from said second and third sub-pixels.

2. The high resolution display according to claim 1, wherein said emissive layers, and said color filters, are arranged such that the first fundamental color, a second fundamental color, and a third fundamental color are emitted from the display panel via said first, second and third sub-pixels arranged in a regularly repeating pattern across the display panel.

3. The high resolution display according to claim 2, wherein said first emissive layer emits blue light, said second emissive layer emits orange light, and said first and second color filters transmit red and green light.

4. The high resolution display panel according to claim 3, wherein said first driving terminal occupies a larger surface area of the display panel than said second and third driving terminals.

* * * * *